US012588416B2

(12) United States Patent
Ono et al.

(10) Patent No.: US 12,588,416 B2
(45) Date of Patent: Mar. 24, 2026

(54) PIEZOELECTRIC ACTUATOR

(71) Applicant: TDK CORPORATION, Tokyo (JP)

(72) Inventors: Shuto Ono, Tokyo (JP); Satoshi Sasaki, Tokyo (JP); Yasuyuki Satoh, Tokyo (JP); Keiji Oguchi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 786 days.

(21) Appl. No.: 18/071,238

(22) Filed: Nov. 29, 2022

(65) Prior Publication Data

US 2023/0240143 A1 Jul. 27, 2023

(30) Foreign Application Priority Data

Jan. 26, 2022 (JP) ................................. 2022-009907

(51) Int. Cl.
*H10N 30/20* (2023.01)
*H10N 30/87* (2023.01)
*H10N 30/88* (2023.01)

(52) U.S. Cl.
CPC ............. *H10N 30/20* (2023.02); *H10N 30/87* (2023.02); *H10N 30/88* (2023.02)

(58) Field of Classification Search
CPC ... H10N 30/708; H10N 30/877; H10N 30/852
See application file for complete search history.

(56) References Cited

U.S. PATENT DOCUMENTS

2008/0278035 A1* 11/2008 Higashionji ....... H10N 30/2023
                                                       310/345
2008/0303380 A1* 12/2008 Takeuchi ............... H02N 2/062
                                                       310/317
2011/0133606 A1* 6/2011 Yoshida ................. H02N 2/006
                                                       310/356

FOREIGN PATENT DOCUMENTS

WO        2010/013361 A1    2/2010

* cited by examiner

*Primary Examiner* — Shafiq Mian

(74) *Attorney, Agent, or Firm* — OLIFF PLC.

(57) ABSTRACT

A piezoelectric actuator includes a piezoelectric element having a rectangular shape, a first supporter, and a second supporter. The piezoelectric element includes a pair of main surfaces opposing each other, a first end surface and a second end surface opposing each other in a long side direction of the pair of main surfaces, and a first side surface and a second side surface opposing each other in a short side direction of the pair of main surfaces. The first supporter is provided to be movable according to deformation of the first end surface. The second supporter is provided to be movable according to deformation of the first side surface. The first supporter includes an opposing portion and a protruding portion. The opposing portion opposes the second supporter in the long side direction. The protruding portion protrudes from the opposing portion and abuts on the second supporter.

9 Claims, 17 Drawing Sheets

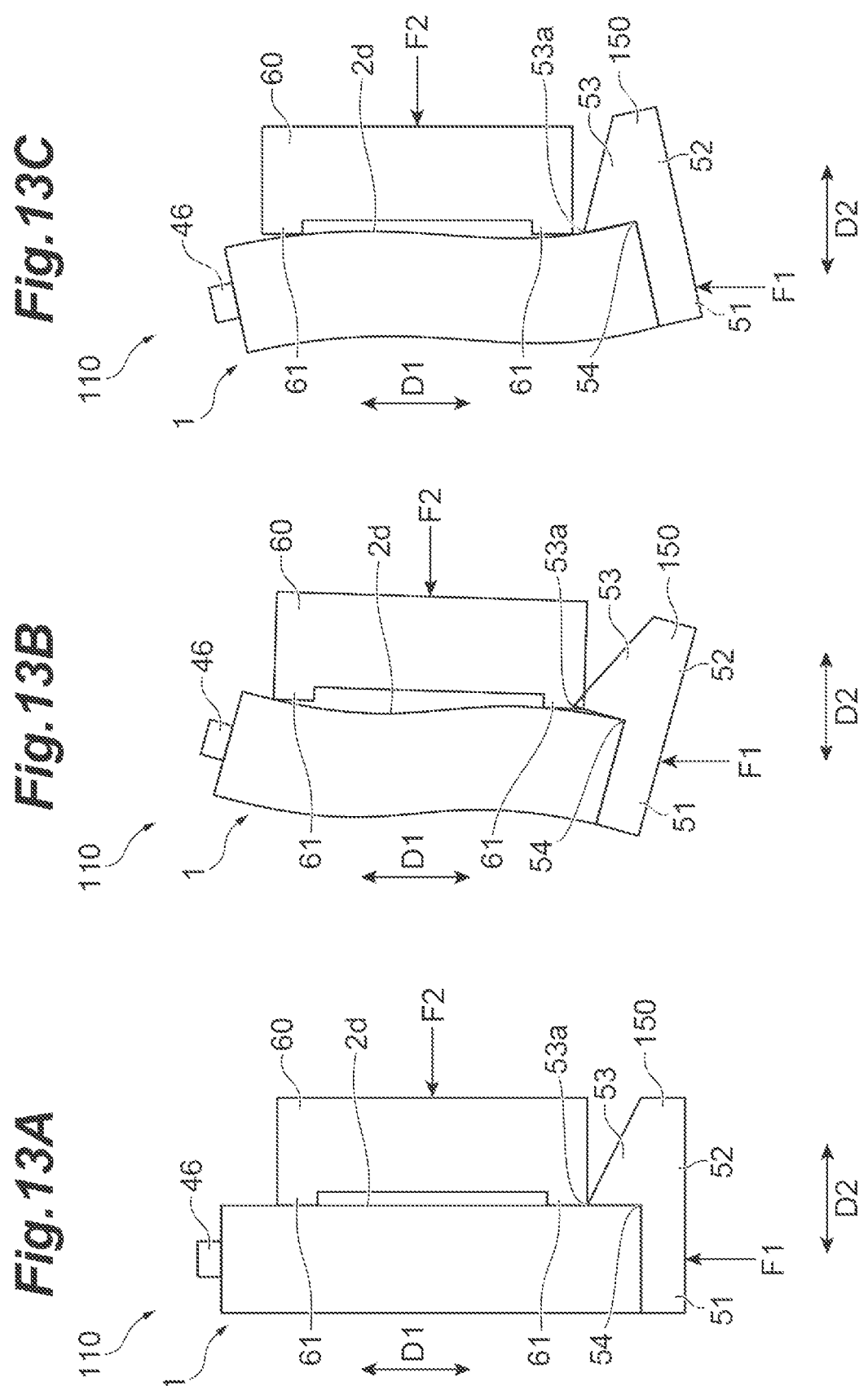

PIEZOELECTRIC ACTUATOR

TECHNICAL FIELD

The present disclosure relates to piezoelectric actuators. This application is based upon and claims the benefit of priority from Japanese Patent Application No. 2022-009907, filed on Jan. 26, 2022, the entire contents of which are incorporated herein by reference.

BACKGROUND

WO2010/013361 discloses a holding device for a piezoelectric vibrator used as a piezoelectric actuator. In this holding device, since the piezoelectric vibrator is held by the plate spring fixed to the side portion of the piezoelectric vibrator, the loss of vibration energy of the piezoelectric vibrator is small.

SUMMARY

In the above-described holding device, it is necessary to fix the plate spring to the piezoelectric vibrator and a support member. For this reason, it takes time to assemble.

An aspect of the present disclosure provides a piezoelectric actuator that is easy to assemble without reducing vibration efficiency of a piezoelectric element.

A piezoelectric actuator according to an aspect of the present disclosure is for driving an object. The piezoelectric actuator includes a piezoelectric element having a rectangular shape, a first supporter, and a second supporter. The piezoelectric element includes a pair of main surfaces opposing each other, a first end surface and a second end surface opposing each other in a long side direction of the pair of main surfaces, and a first side surface and a second side surface opposing each other in a short side direction of the pair of main surfaces. The first supporter is provided to be movable according to deformation of the first end surface. The second supporter is provided to be movable according to deformation of the first side surface. The first supporter includes an opposing portion and a protruding portion. The opposing portion opposes the second supporter in the long side direction. The protruding portion protrudes from the opposing portion in the long side direction and abuts on the second supporter.

In the piezoelectric actuator, the first supporter is provided to be movable according to the deformation of the first end surface of the piezoelectric element. The second supporter is provided to be movable according to the deformation of the first side surface of the piezoelectric element. Since the first supporter and the second supporter are provided to be separately movable as described above, the vibration of the piezoelectric element is less likely to be inhibited. The first supporter includes a protruding portion that abuts on the second supporter. Therefore, the position of the second supporter relative to the first supporter is easily determined at the time of assembly. Therefore, assembly is easy.

A distance at which an abutting portion of the protruding portion with the second supporter is spaced apart from the piezoelectric element in the short side direction may be 0.3 times or more and 0.7 times or less of a length of the piezoelectric element in the short side direction. In this case, even if the first supporter and the second supporter move according to the vibration of the piezoelectric element, the first supporter and the second supporter are prevented from interfering with each other. Therefore, the vibration of the piezoelectric element is less likely to be disturbed.

The piezoelectric actuator may further include a first biasing member and a second biasing member. The first biasing member biases the first supporter in the long side direction to bring the first supporter into contact with the piezoelectric element. The second biasing member biases the second supporter in the short side direction to bring the second supporter into contact with the piezoelectric element. In this case, a configuration in which the first supporter is movable according to the deformation of the first end surface is easily realized. A configuration in which the second supporter is movable according to the deformation of the first side surface is easily realized.

The piezoelectric actuator may further include a first biasing member and a second biasing member. The first biasing member biases the first supporter in the long side direction to bring the first supporter into contact with the piezoelectric element. The second biasing member biases the second supporter in the short side direction to bring the second supporter into contact with the piezoelectric element. The second supporter may include a pair of support portions spaced apart from each other in the long side direction and supporting the first side surface. The second biasing member may be located between the pair of support portions in the long side direction. In this case, a configuration in which the first supporter is movable according to the deformation of the first end surface is easily realized. A configuration in which the second supporter is movable according to the deformation of the first side surface is easily realized. Since the second supporter supports the first side surface by the pair of support portions, it can reliably support the first side surface. Since the second biasing member is located between the pair of support portions in the long side direction, the biasing force can be applied to the pair of support portions in a balanced manner.

The second supporter may include a pair of support portions. The pair of support portions are spaced apart from each other in the long side direction. The pair of support portions support the first side surface. In this case, since the second supporter supports the first side surface by a pair of support portions, the first side surface can be reliably supported.

Each of the pair of support portions may include a curved surface that abuts on the piezoelectric element. In this case, damage to the pair of support portions and damage to the piezoelectric element due to contact between the pair of support portions and the piezoelectric element are suppressed.

The protruding portion may include a curved surface. In this case, damage to the protruding portion and damage to the second supporter due to contact between the protruding portion and the second supporter are suppressed.

The first supporter includes a positioning portion that defines a position of the piezoelectric element in the short side direction. In this case, it is possible to prevent the piezoelectric element from moving in the short side direction on the first supporter.

The first supporter may be rotatably connected to the second supporter by a coupling shaft provided on the protruding portion. In this case, since the position of the second supporter is reliably determined with respect to the first supporter, the assembly is easier.

BRIEF DESCRIPTION OF THE DRAWINGS

FIGS. 13A, 13B, and 13C are side views schematically illustrating movements of a piezoelectric actuator according to a comparative example.

of a piezoelectric actuator according to a comparative example.

Figure 14:
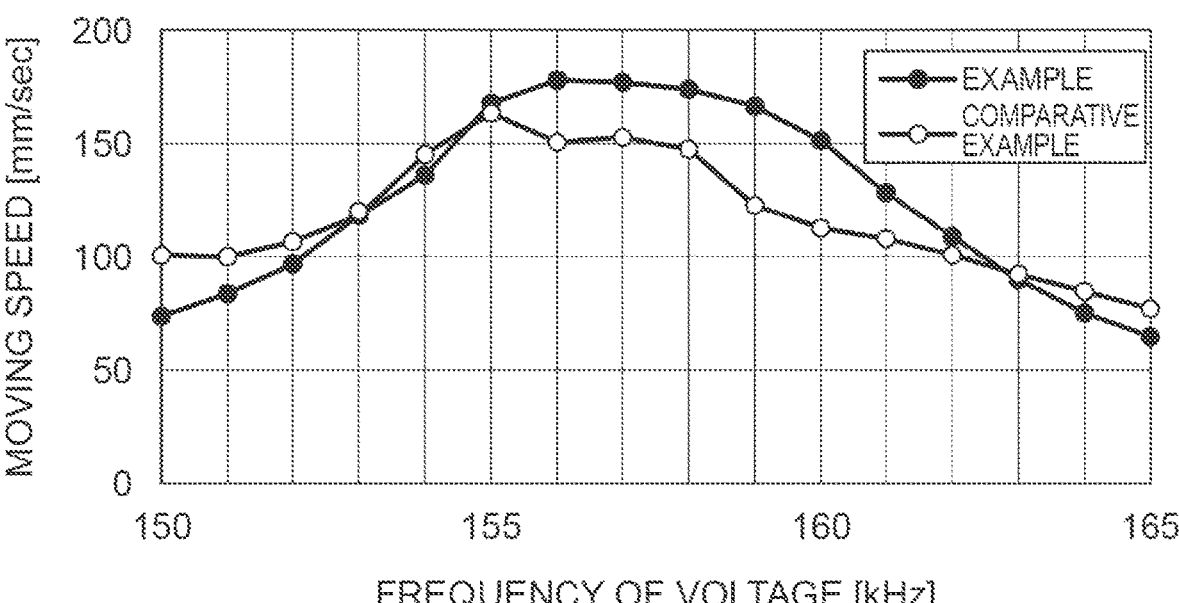

FIG. 14 is a graph showing the relationship between the frequency of the voltage applied to the piezoelectric element and the moving speed of the moving object.

Figure 15:
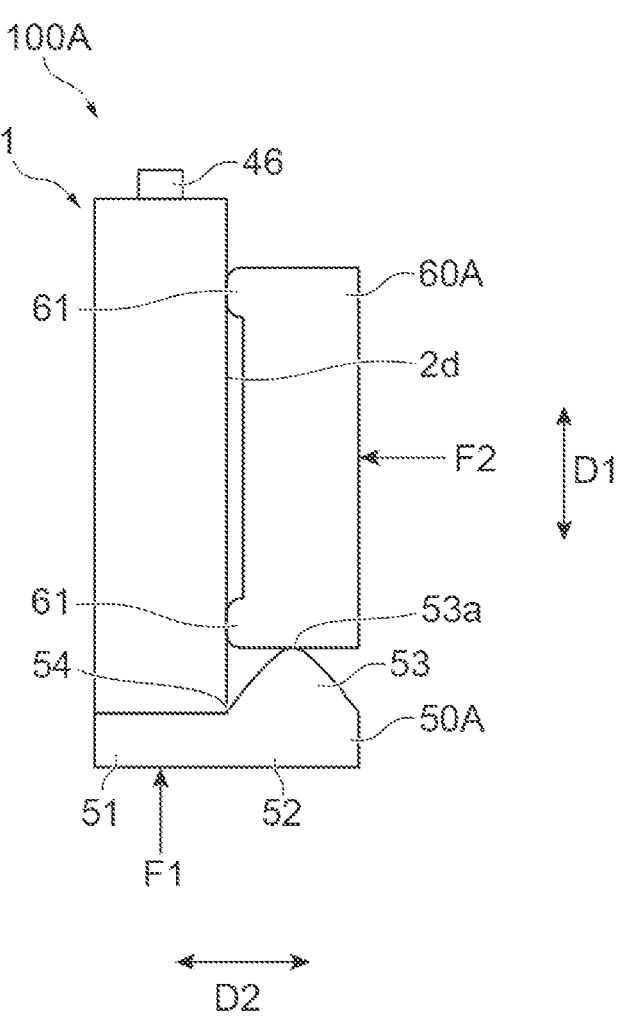

FIG. 15 is a side view illustrating a piezoelectric actuator according to a second embodiment.

Figure 16:
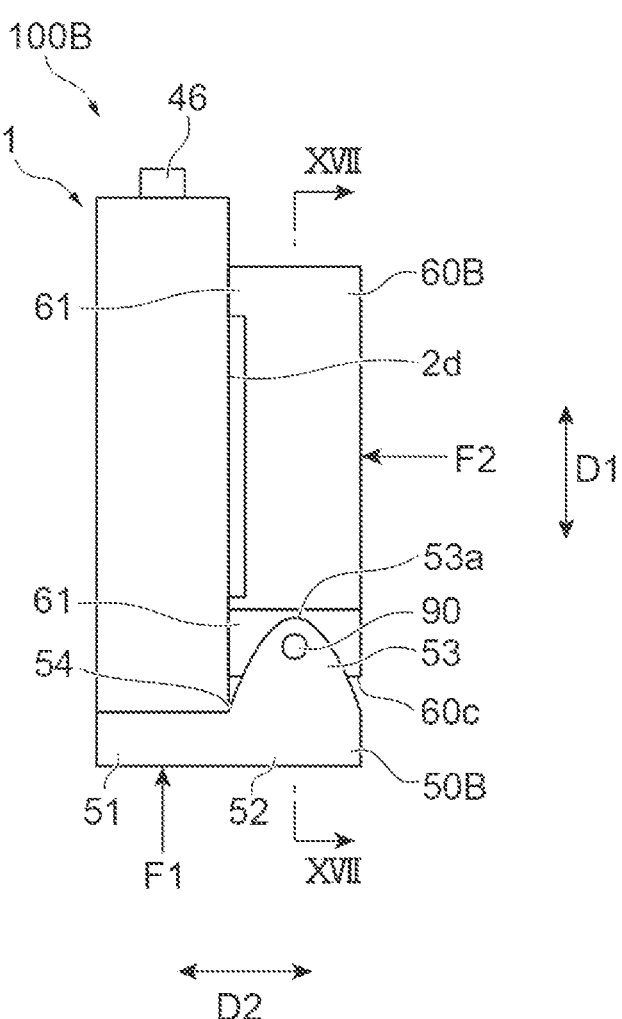

FIG. 16 is a side view illustrating a piezoelectric actuator according to a third embodiment.

Figure 17:
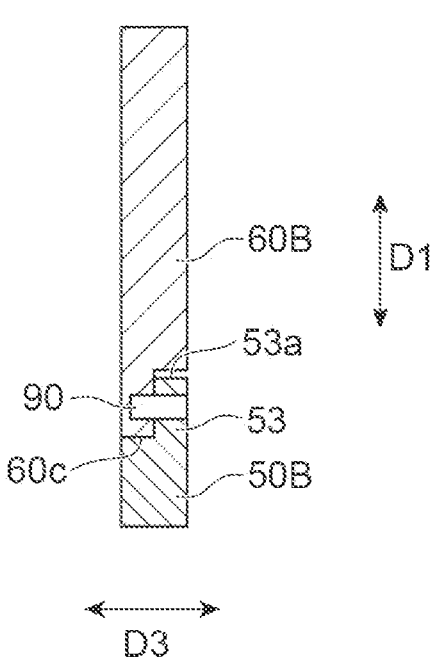

FIG. 17 is a cross-sectional view taken along line XVII-XVII of FIG. 16.

DETAILED DESCRIPTION

Hereinafter, embodiments will be described in detail with reference to the accompanying drawings. In the description of the drawings, the same or corresponding elements are denoted by the same reference numerals, and redundant description is omitted.

First Embodiment

Figure 1:
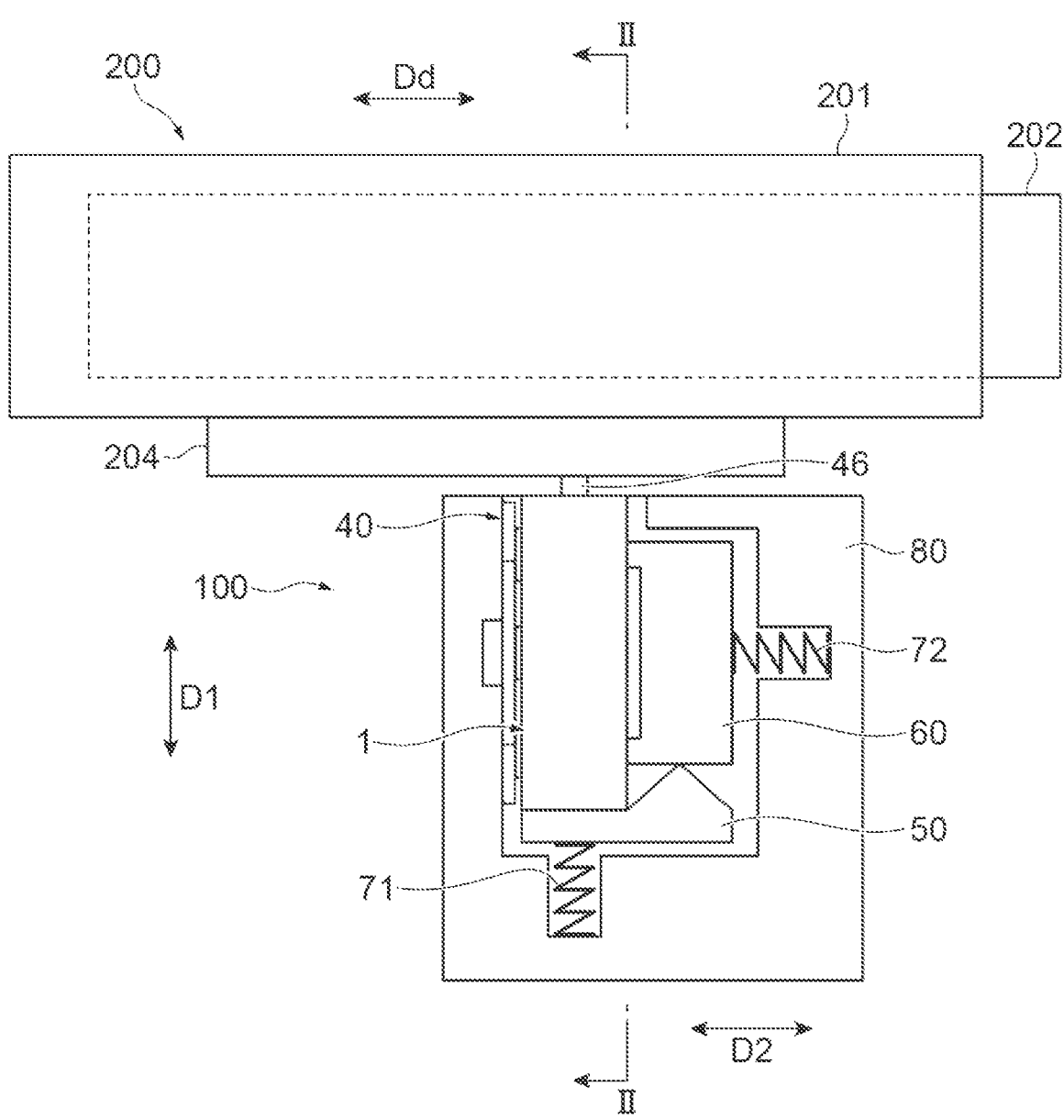
FIG. 1 is a side view illustrating a piezoelectric actuator according to a first embodiment and a moving object.
Figure 2:
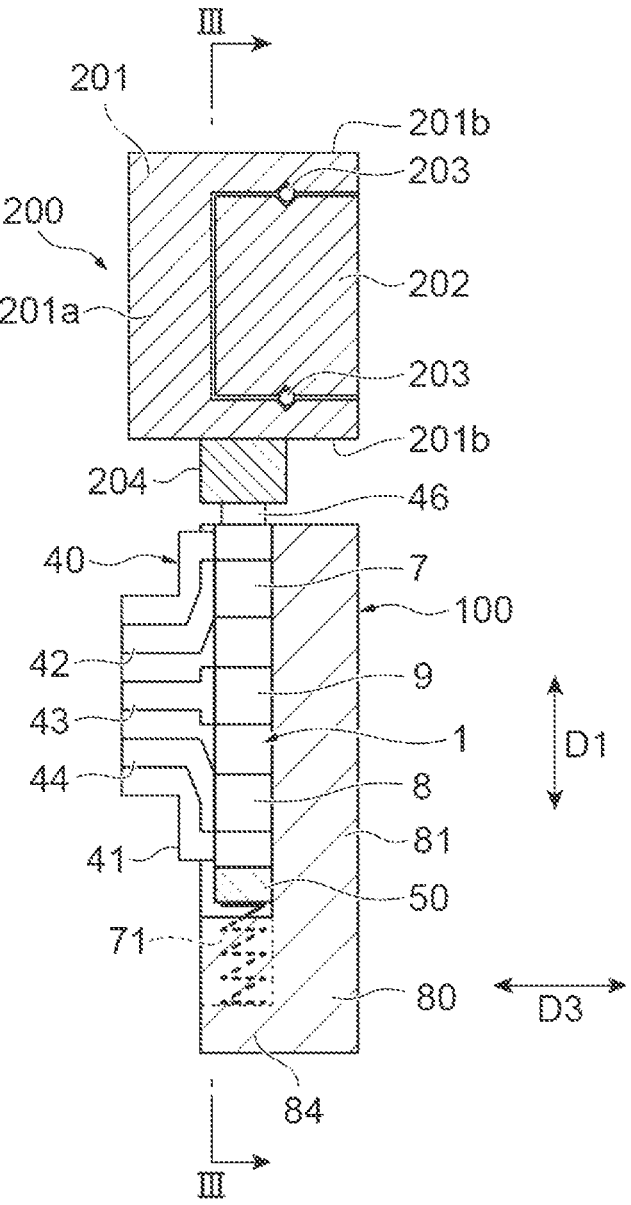
FIG. 2 is a cross-sectional view taken along line II-II of FIG. 1.
Figure 3:
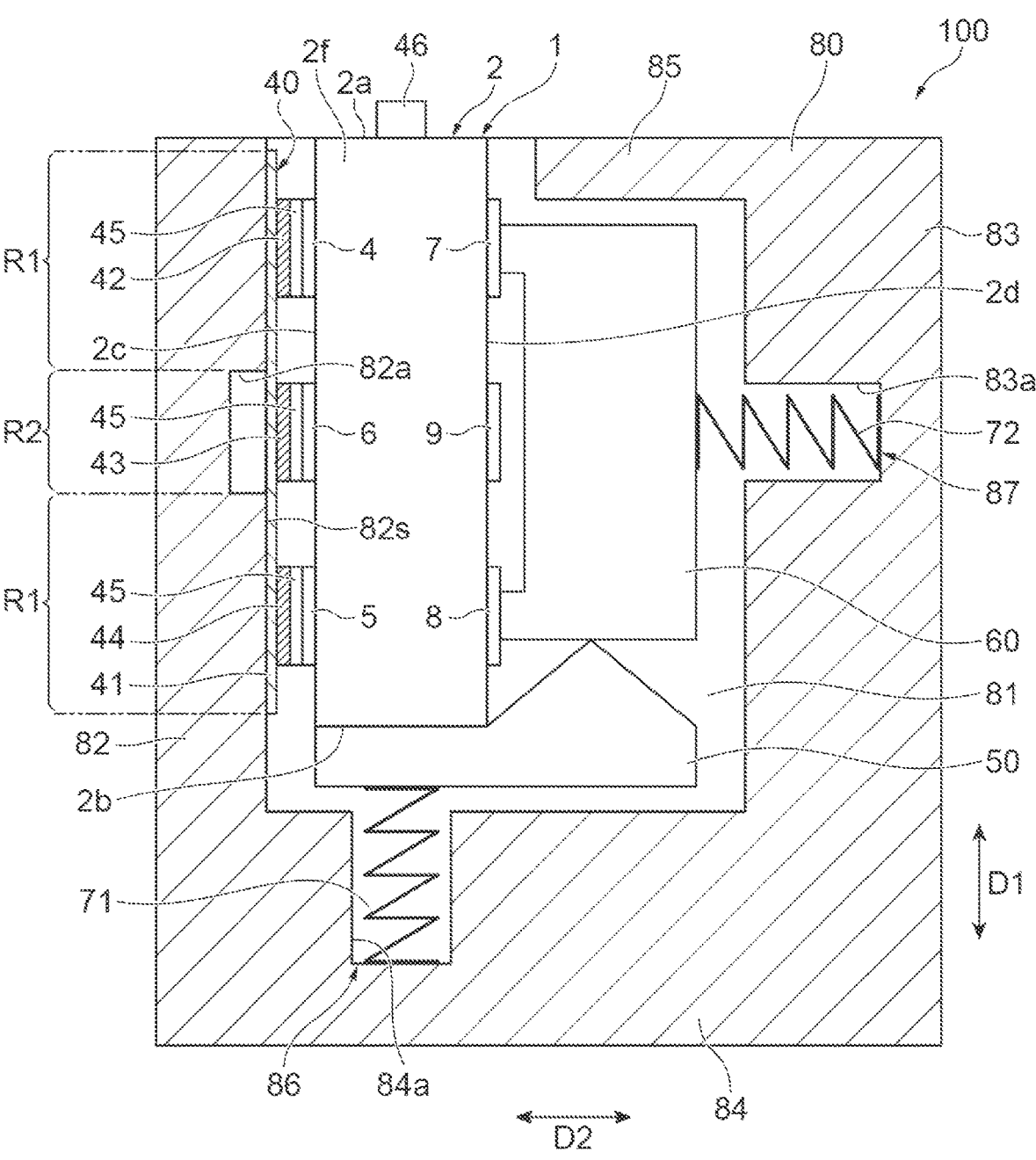
FIG. 3 is a cross-sectional view taken along line III-III of FIG. 2.

As illustrated in FIGS. 1 to 3, a piezoelectric actuator 100 according to a first embodiment includes a piezoelectric element 1, a wiring member 40, a contact 46, a first supporter 50, a second supporter 60, a first biasing member 71, a second biasing member 72, and a housing 80. The piezoelectric actuator 100 is used as an ultrasonic motor and is configured to be capable of driving a moving object 200, which is a driven object, in a driving direction Dd. In FIG. 3, the moving object 200 is not shown.

(Moving Object)

The moving object 200 includes a rail 201, a shaft member 202, a plurality of pairs of a bearing 203, and a sliding plate 204. The rail 201 is a groove-like member having a U-shaped cross section and extending in the driving direction Dd. The rail 201 includes a bottom 201a and a pair of a side portion 201b opposed to each other. A groove extending in the driving direction Dd is provided on an inner surface of each side 201b. The shaft member 202 is a rod-shaped member having a rectangular cross section and extends in the driving direction Dd. The shaft member 202 is fitted into the groove of the rail 201. On the outer side surface of the shaft member 202, a groove extending in the driving direction Dd is provided at a position opposing the groove provided on the inner surface of each side 201b.

The bearing 203 is disposed between the groove of the side portion 201b of the rail 201 and the groove of the shaft member 202. The sliding plate 204 is attached to one side portion 201b of the rail 201 and extends in the driving direction Dd. In the moving object 200, the vibration of the piezoelectric actuator 100 is transmitted to the rail 201 via the sliding plate 204, and the rail 201 is driven in the driving direction Dd together with the sliding plate 204.

(Piezoelectric Element)

Figure 4:
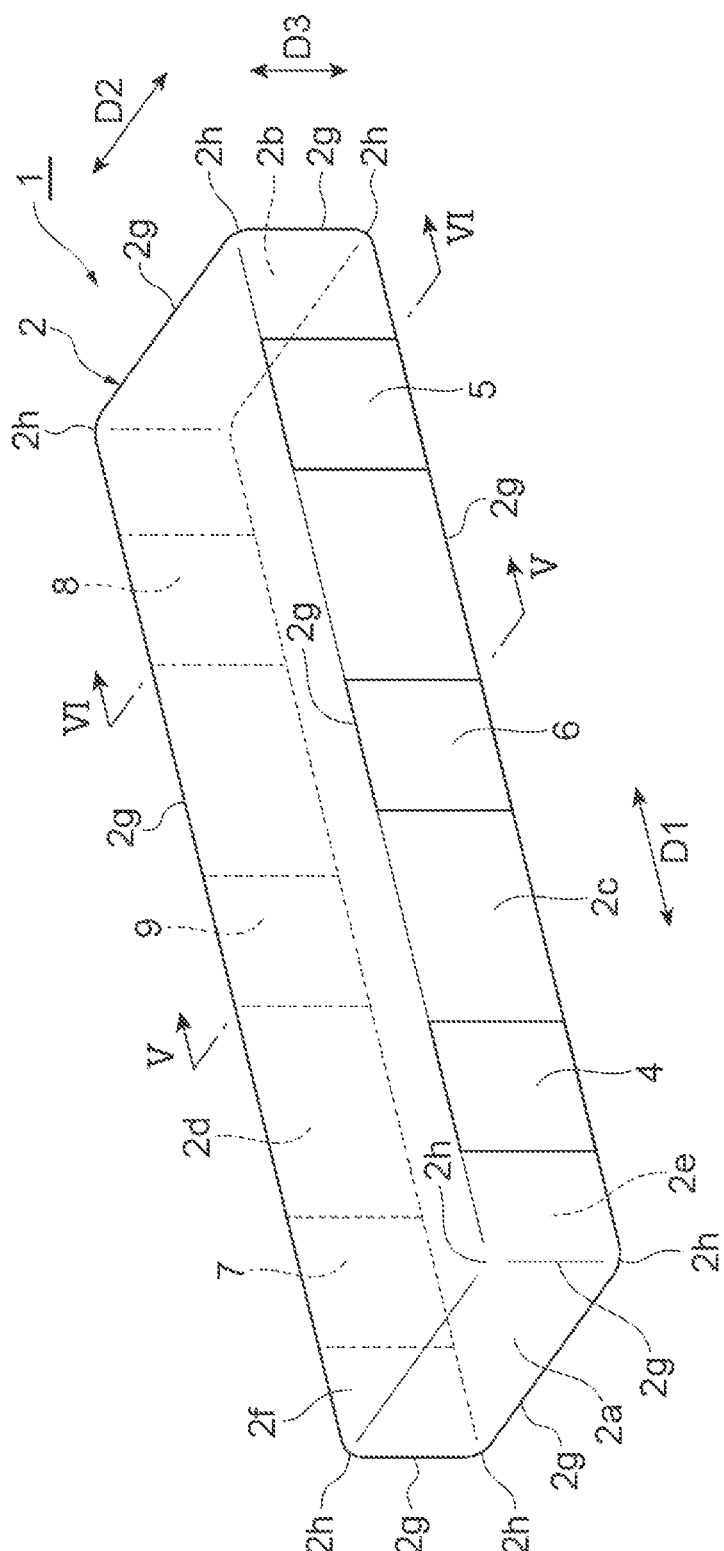
FIG. 4 is a perspective view of the piezoelectric element of FIG. 1.

The piezoelectric element 1 will be described with reference to FIGS. 4 to 10. As shown in FIG. 4, the piezoelectric element 1 includes a piezoelectric element body 2 and a plurality of external electrodes 4, 5, 6, 7, 8, and 9. The piezoelectric element body 2 has a rectangular parallelepiped shape. The rectangular parallelepiped shape includes a rectangular parallelepiped shape in which corners and ridge portions are chamfered, and a rectangular parallelepiped shape in which corners and ridge portions are rounded. The piezoelectric element body 2 includes a pair of end surfaces 2a and 2b opposing each other, a pair of side surfaces 2c and 2d opposing each other, and a pair of main surfaces 2e and 2f opposing each other.

An opposing direction D1 of the end surfaces 2a and 2b, an opposing a direction D2 of the side surfaces 2c and 2d, and an opposing a direction D3 of the main surfaces 2e and 2f intersect each other. In the present embodiment, the direction D1, the direction D2, and the direction D3 are orthogonal to each other. The direction D1 is a length direction of the piezoelectric element body 2. The direction D2 is a width direction of the piezoelectric element body 2. The direction D3 is a thickness direction of the piezoelectric element body 2. Each of the main surfaces 2e and 2f has a rectangular shape. A long side direction of the main surfaces 2e and 2f coincides with the direction D1. A short side direction of the main surfaces 2e and 2f coincides with the direction D2.

Each end surfaces 2a and 2b extends in the direction D2 so as to connect the side surfaces 2c and 2d. Each end surfaces 2a and 2b also extends in the direction D3 so as to connect the main surfaces 2e and 2f. Each side surfaces 2c and 2d extends in the direction D1 so as to connect the end surfaces 2a and 2b. Each side surfaces 2c and 2d also extends in the direction D3 so as to connect the main surfaces 2e and 2f. Each main surfaces 2e and 2f extends in the direction D1 so as to connect the end surfaces 2a and 2b. Each main surfaces 2e and 2f also extends in the direction D2 so as to connect the side surfaces 2c and 2d.

The width (the length in the direction D2) of the piezoelectric element body 2 is, for example, 2.5 mm. The length (the length in the direction D1) of the piezoelectric element body 2 is, for example, 9 mm. The thickness (the length in the direction D3) of the piezoelectric element body 2 is, for example, 1 mm. The width of the piezoelectric element body 2 is longer than the thickness of the piezoelectric element body 2 and shorter than the length of the piezoelectric element body 2.

Each surfaces 2a, 2b, 2c, 2d, 2e, and 2f of the piezoelectric element body 2 is polished surfaces polished by barrel polishing, for example. Each ridge portion 2g positioned between two adjacent surfaces among the surfaces 2a, 2b, 2c, 2d, 2e, and 2f has a rounded chamfered shape. Each ridge portion 2g has is constituted by a curved surface. Each corner portion 2h positioned among three adjacent surfaces among the surfaces 2a, 2b, 2c, 2d, 2e, and 2f has a rounded chamfered shape. Each corner portion 2h is constituted by a curved surface.

The external electrodes 4, 5, and 6 are arranged in the side surface 2c of the piezoelectric element body 2. The external electrodes 4, 5, and 6 are separated from each other. The external electrodes 4, 5, and 6 are arranged side by side in the direction D1. The external electrode 4 is disposed on the end surface 2a side. The external electrode 4 is spaced apart from the end surface 2a. The external electrode 5 is disposed on the end surface 2b side. The external electrode 5 is spaced apart from the end surface 2b. The external electrode 6 is disposed between the external electrode 4 and the external electrode 5. The external electrode 6 is spaced apart from each of the external electrode 4 and the external electrode 5.

The external electrodes 4, 5, and 6 have the same shape. Each of the external electrodes 4, 5, and 6 has a rectangular shape when viewed from the direction D2. Each of the external electrodes 4, 5, and 6 extends in the direction D3 so as to connect the main surface 2e and the main surface 2f. Each of the external electrodes 4, 5, and 6 is formed on the entire side surface 2c in the direction D3. The external electrodes 4, 5, and 6 are also provided on each of the ridge portion 2g between the side surface 2c and the main surface 2e and the ridge portion 2g between the side surface 2c and the main surface 2f.

The external electrodes 7, 8, and 9 are arranged in the side surface 2d of the piezoelectric element body 2. The external electrodes 7, 8, and 9 are separated from each other. The external electrodes 7, 8, and 9 are arranged side by side in the direction D1. The external electrode 7 is disposed on the end surface 2a side. The external electrode 7 is spaced apart from the end surface 2a. The external electrode 8 is disposed on the end surface 2b side. The external electrode 8 is spaced apart from the end surface 2b. The external electrode 9 is disposed between the external electrode 7 and the external electrode 8. The external electrode 9 is spaced apart from each of the external electrode 7 and the external electrode 8.

The external electrodes 7, 8, and 9 have the same shape. Each of the external electrodes 7, 8, and 9 has a rectangular shape when viewed from the direction D2. Each of the external electrodes 7, 8, and 9 extends in the direction D3 so as to connect the main surface 2e and the main surface 2f. Each of the external electrodes 7, 8, and 9 is formed on the entire side surface 2d in the direction D3. The external electrodes 7, 8, and 9 are also provided on each of the ridge portion 2g between the side surface 2d and the main surface 2e and the ridge portion 2g between the side surface 2d and the main surface 2f.

The external electrode 4 and the external electrode 7 oppose each other in the direction D2. The external electrode 4 and the external electrode 7 are provided so as to overlap each other when viewed from the direction D2. The external electrode 5 and the external electrode 8 oppose each other in the direction D2. The external electrode 5 and the external electrode 8 are provided so as to overlap each other when viewed from the direction D2. The external electrode 6 and the external electrode 9 oppose each other in the direction D2. The external electrode 6 and the external electrode 9 are provided so as to overlap each other when viewed from the direction D2.

The external electrodes 4, 5, 6, 7, 8, and 9 are formed on the side surfaces 2c and 2d by, for example, a sputtering method. The external electrodes 4, 5, 6, 7, 8, and 9 may be formed by a vapor deposition method. Examples of the film structure constituting the external electrodes 4, 5, 6, 7, 8, and 9 include Cr/Ni, NiCu/Ag, SnAg, and Au. The thickness of the external electrodes 4, 5, 6, 7, 8, and 9 is, for example, 0.5 μm or more and 2.5 μm or less. The length of the external electrodes 4, 5, 6, 7, 8, and 9 in the direction D1 is, for example, 1 mm or more and 1.5 mm or less.

The external electrodes 4, 5, 6, 7, 8, and 9 may be a baked electrode layer formed by baking a conductive paste. As the conductive paste, a conductive paste containing a conductive material containing Ag as a main component can be used. The external electrodes 4, 5, 6, 7, 8, and 9 may further include plating layers formed by electroplating. Examples of the plating layers include a Ni/Au plating layer.

Figure 7:
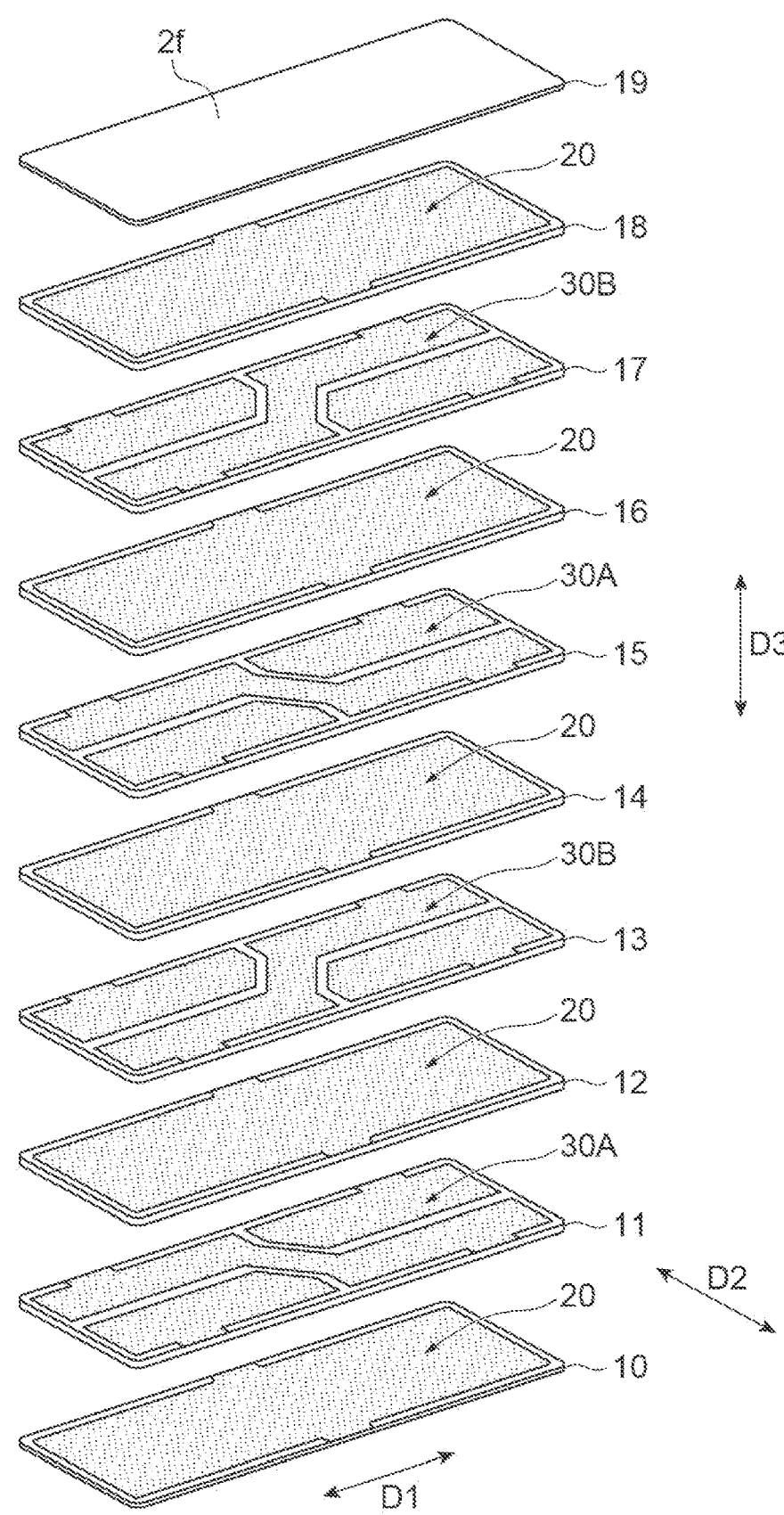
FIG. 7 is an exploded perspective view of the piezoelectric element of FIG. 4.

As shown in FIG. 7, the piezoelectric element body 2 is a laminated body and includes piezoelectric layers 10 to 19 laminated in the direction D3. The piezoelectric element body 2 is formed by laminating the piezoelectric layers 10 to 19 in the direction D3. The laminating direction of the piezoelectric layers 10 to 19 coincides with the opposing direction of the main surface 2e and 2f. Each of the piezoelectric layers 10 to 19 have a rectangular plate shape.

A piezoelectric layers 10 and 19 are disposed at both ends in the laminating direction (the direction D3). The outer surface of the piezoelectric layer 10 constitutes the main surface 2e. The outer surface of the piezoelectric layer 19 constitutes the main surface 2f. The piezoelectric layers 11 to 18 are disposed between the piezoelectric layers 10 and 19 in the laminating direction. The thickness (the length in the direction D3) of each of the piezoelectric layers 10 and 19 disposed at both ends in the laminating direction is thinner than the thickness (length in the direction D3) of each of the piezoelectric layers 11 to 18 disposed between the piezoelectric layers 10 and 19.

The thicknesses of the piezoelectric layers 10 and 19 are, for example, 0.02 mm or more and 0.03 mm or less. The thicknesses of the piezoelectric layers 11 to 18 in the laminating direction are, for example, 0.12 mm or more and 0.2 mm or less. In the present embodiment, the piezoelectric layers 10 and 19 have the same thickness, but may have different thicknesses. The plurality of the piezoelectric layers 11 to 18 have the same thickness, but may have different thicknesses.

The piezoelectric layers 10 to 19 is made of a piezoelectric ceramic material. PZT [Pb (Zr, Ti) $O_3$], PT (PbTiO$_3$), PLZT [(Pb, La) (Zr, Ti) $O_3$] or barium titanate (BaTiO$_3$) and the like is used as the piezoelectric ceramic material. Each of the piezoelectric layers 10 to 19 is a sintered body of a ceramic green sheet containing the piezoelectric ceramic material. In the actual piezoelectric element body 2, the piezoelectric layers 10 to 19 are integrated to such an extent that boundaries between the piezoelectric layers 10 to 19 cannot be visually recognized.

The piezoelectric element 1 is disposed in the piezoelectric element body 2 and includes a plurality of internal electrodes 20, 30A, and 30B for generating a plurality of active regions in the piezoelectric element body 2. In the piezoelectric element 1, the internal electrodes 30A and 30B as the first internal electrode and the internal electrode 20 as the second internal electrode are alternately arranged via each of the piezoelectric layers 10 to 19. The first internal electrode may be either the internal electrode 30A or 30B. The piezoelectric element 1 needs to include at least one internal electrode 30A and at least one internal electrode 30B. The plurality of the internal electrodes 20, 30A, and 30B are laminated such that a pair of the internal electrode 20 is positioned at both ends in the laminating direction (the direction D3).

In the present embodiment, the piezoelectric element 1 includes a plurality of the internal electrodes 20, a plurality of the internal electrodes 30A, and a plurality of the internal electrodes 30B. Specially, the piezoelectric element 1 includes five the internal electrode 20 disposed on the piezoelectric layers 10, 12, 14, 16, and 18, two the internal electrode 30A disposed on the piezoelectric layers 11 and 15, and two the internal electrode 30B arranged on the piezoelectric layers 13 and 17.

The internal electrodes 20 are disposed between the piezoelectric layer 10 and the piezoelectric layer 11, between the piezoelectric layer 12 and the piezoelectric layer 13, between the piezoelectric layer 14 and a piezoelectric layer 15, between the piezoelectric layer 16 and a piezoelectric layer 17, and between the piezoelectric layer 18 and the piezoelectric layer 19, respectively. The internal electrodes 30A are disposed between the piezoelectric layer 11 and the piezoelectric layer 12 and between the piezoelectric layer 15 and the piezoelectric layer 16, respectively. The plurality of the internal electrode 30B are disposed between the piezoelectric layer 13 and the piezoelectric layer 14 and between the piezoelectric layer 17 and the piezoelectric layer 18, respectively.

The internal electrode 30A disposed on the piezoelectric layer 11 opposes the internal electrode 20 via the piezoelectric layer 11 and opposes the internal electrode 20 via the piezoelectric layer 12. The internal electrode 30B disposed on the piezoelectric layer 13 opposes the internal electrode 20 via the piezoelectric layer 13 and opposes the internal electrode 20 via the piezoelectric layer 14. The internal electrode 30A disposed on the piezoelectric layer 15 opposes the internal electrode 20 via the piezoelectric layer 15 and opposes the internal electrode 20 via the piezoelectric layer 16. The internal electrode 30B disposed on the piezoelectric layer 17 opposes the internal electrode 20 via the piezoelectric layer 17 and opposes the internal electrode 20 via the piezoelectric layer 18.

Each of the internal electrodes 20, 30A, and 30B is made of a conductive material (for example, Ag/Pd, Pt, Pd, or Cu). Each of the internal electrodes 20, 30A, and 30B is constituted as sintered bodies of a conductive paste containing the conductive material.

Figure 8:
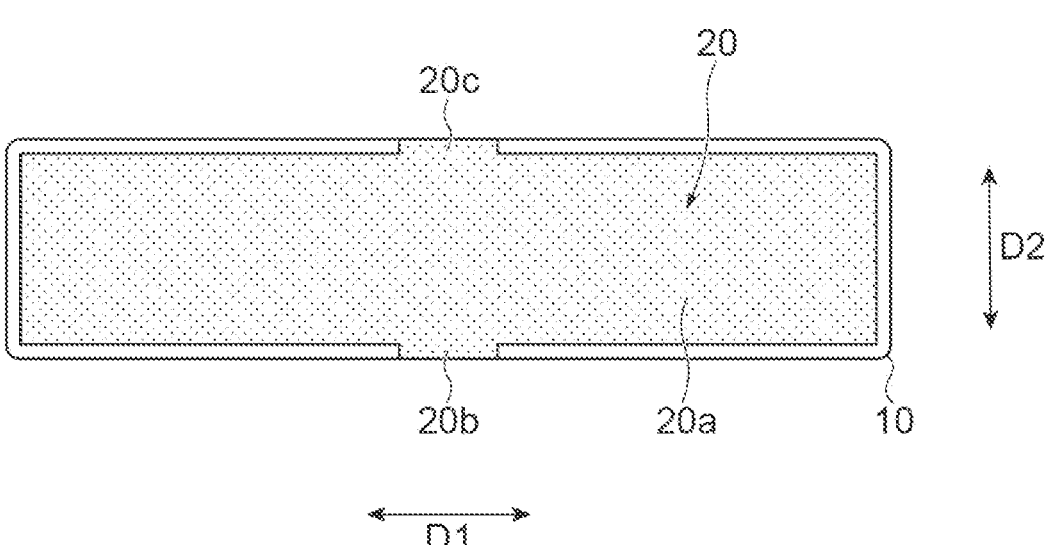
FIG. 8 is a plan view illustrating an internal electrode disposed on a piezoelectric layer.

FIG. 8 is a plan view showing the internal electrode 20 disposed on the piezoelectric layer 10. As shown in FIG. 8, the internal electrode 20 includes a main electrode part 20a, connecting parts 20b, and 20c. The main electrode part 20a has a rectangular shape in which the longitudinal direction of the piezoelectric element body 2 is the longitudinal direction of the main electrode part 20a. The main electrode part 20a is provided apart from the end surfaces 2a and 2b and the side surfaces 2c and 2d.

Figure 5:
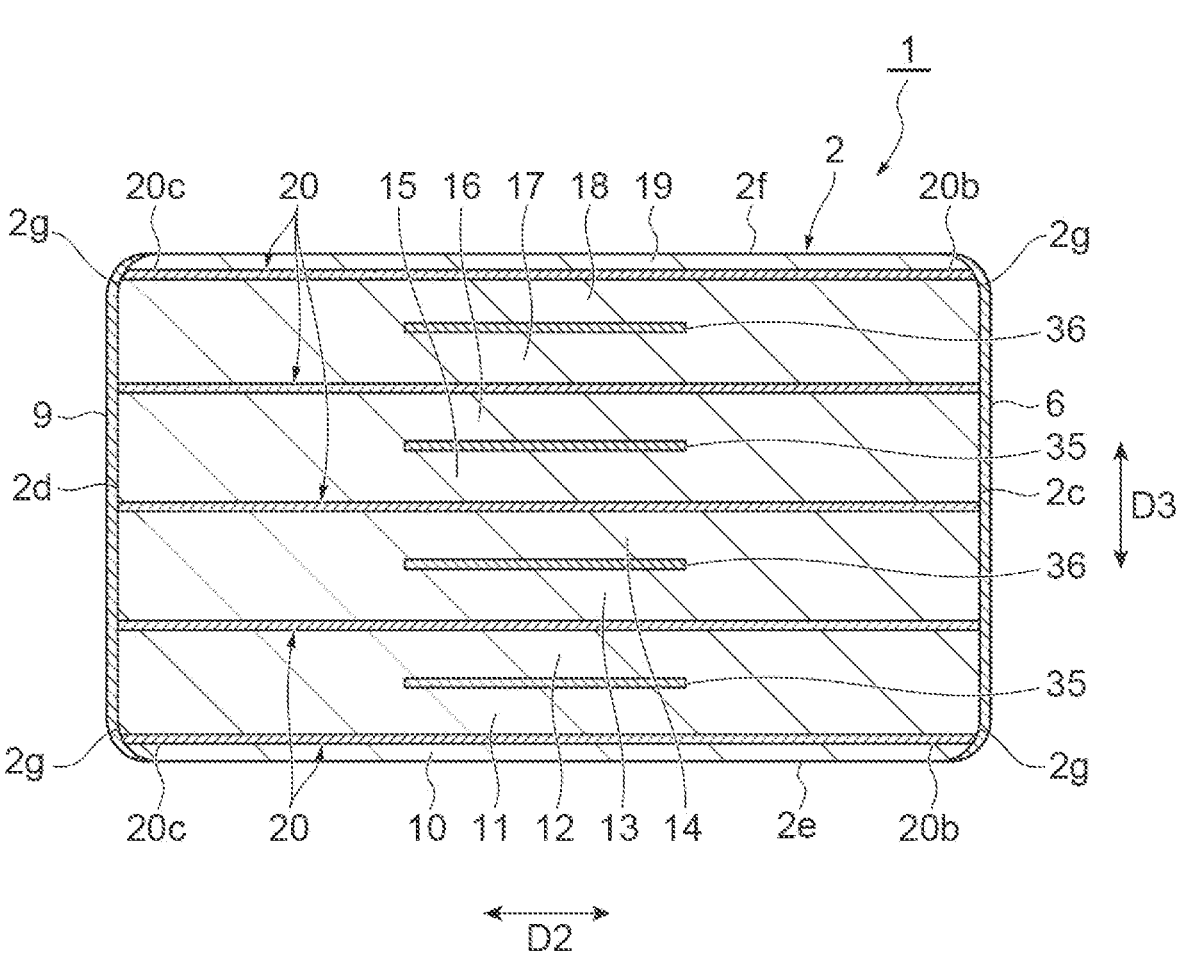
FIG. 5 is a cross-sectional view taken along line V-V of FIG. 4.
Figure 6:
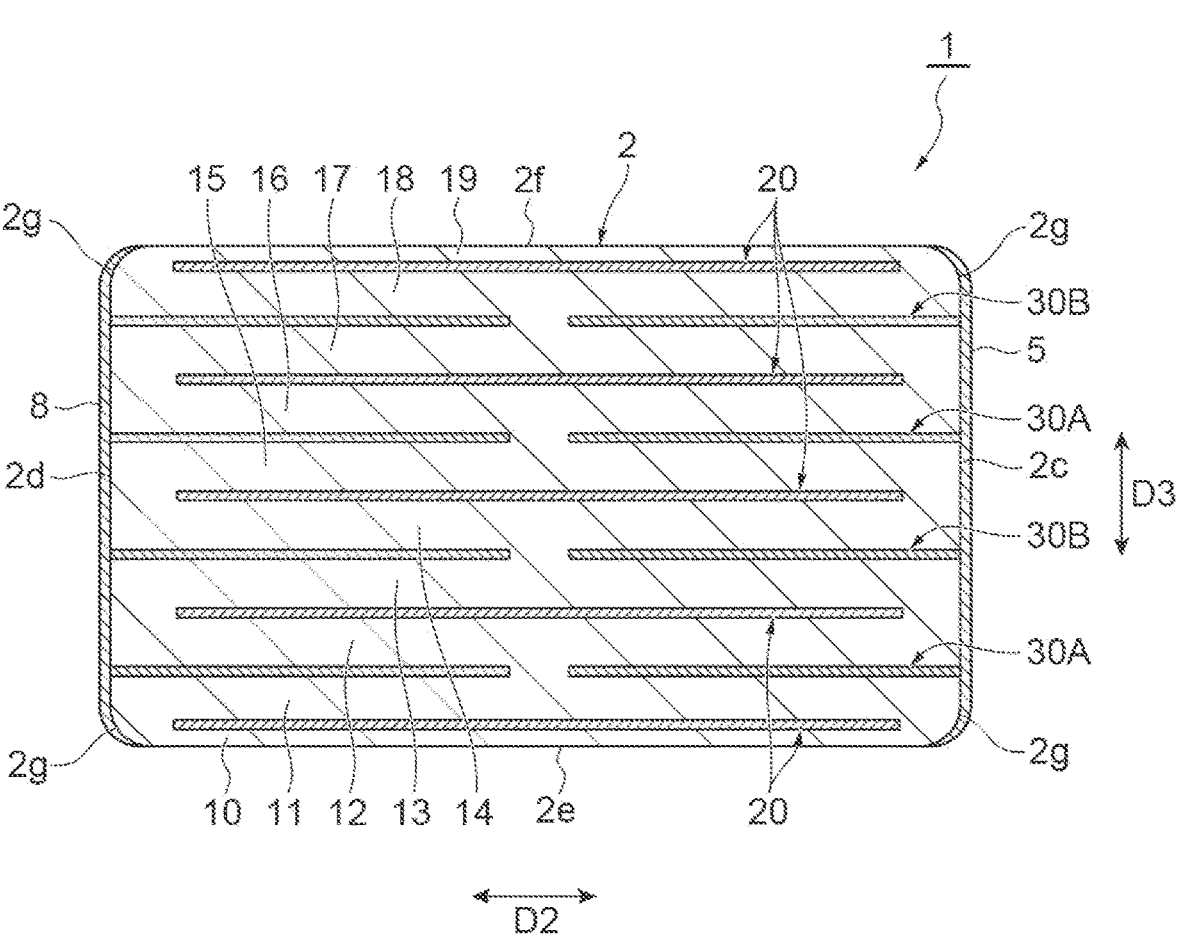
FIG. 6 is a cross-sectional view taken along line VI-VI of FIG. 4.

As shown in FIG. 5, the connecting part 20b extends from one side surface along the longitudinal direction (the direction D1) of the main electrode part 20a to the side surface 2c side of the piezoelectric element body 2, and is exposed on the ridge portion 2g between the side surface 2c and the main surface 2e of the piezoelectric element body 2. The connecting part 20b is located at the center of the piezoelectric element body 2 in the longitudinal direction (the direction D1). The connecting part 20c extends from the other side surface along the longitudinal direction of the main electrode part 20a to the side surface 2d side of the piezoelectric element body 2, and is exposed on the ridge portion 2g between the side surface 2d and the main surface 2e of the piezoelectric element body 2. The connecting part 20c is located at the center of the piezoelectric element body 2 in the longitudinal direction (the direction D1).

The internal electrodes 20 are also disposed on the piezoelectric layers 12, 14, 16, and 18. The internal electrodes 20 disposed on the piezoelectric layers 12, 14, 16, and 18 and the internal electrode 20 disposed on the piezoelectric layer 10 have the same shape. Each of the internal electrodes 20 opposes a plurality of electrode portions 31, 32, 33, and 34 (see FIGS. 9 and 10) included in the internal electrodes 30A and 30B via the piezoelectric layers 11 to 18. Each of the internal electrodes 20 functions as a common electrode.

In the internal electrode 20 disposed on the piezoelectric layers 12, 14, and 16, the connecting part 20b is exposed on the side surface 2c of the piezoelectric element body 2, and the connecting part 20c is exposed on the side surface 2d of the piezoelectric element body 2. In the internal electrode 20 disposed on the piezoelectric layer 18, the connecting part 20b is exposed on the ridge portion 2g between the side surface 2c and the main surface 2f of the piezoelectric element body 2, and the connecting part 20c is exposed on the ridge portion 2g between the side surface 2d and the main surface 2f of the piezoelectric element body 2. The connecting part 20b of each internal electrode 20 is connected to the external electrode 6. The connecting part 20c of each internal electrode 20 is connected to the external electrode 9. The internal electrodes 20 disposed on the piezoelectric layers 10 and 18 are connected to the corresponding the external electrodes 6 and 9 in the ridge portions 2g. The internal electrodes 20 located on the piezoelectric layers 12, 14, and 16 are connected to the external electrodes 6 and 9 in the side surfaces 2c and 2d.

Figure 9:
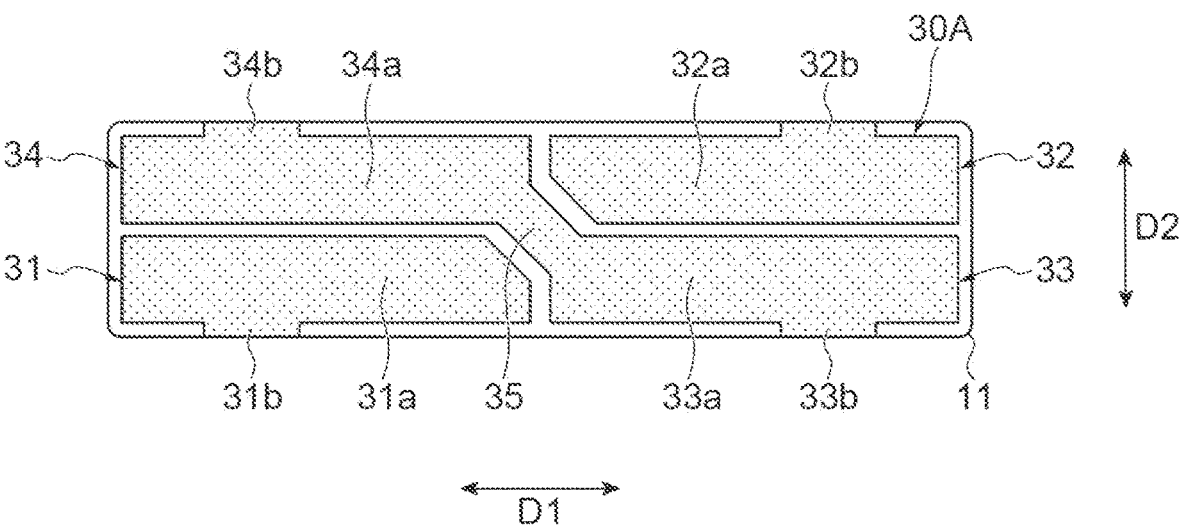
FIG. 9 is a plan view illustrating internal electrodes disposed on a piezoelectric layer.

FIG. 9 is a plan view showing the internal electrode 30A disposed on the piezoelectric layer 11. As shown in FIG. 9, the internal electrode 30A includes the electrode portions 31, 32, 33, and 34 and a connecting portion 35. The internal electrode 30A is also disposed on the piezoelectric layer 15. The internal electrode 30A disposed on the piezoelectric layer 15 and the internal electrode 30A disposed on the piezoelectric layer 11 have the same shape.

The electrode portions 31, 32, 33, and 34 are arranged in two rows in each of the direction D1 and the direction D2 in a matrix form. The electrode portions 31 and 33 are arranged side by side along the direction D1 on the side surface 2c side. The electrode portions 32 and 34 are arranged side by side along the direction D1 on the side surface 2d side. The electrode portions 31 and 34 are arranged side by side along the direction D2 on the end surface 2a side. The electrode portions 32 and 33 are arranged side by side along the direction D2 on the end surface 2b side.

The electrode portions 31, 32, 33, and 34 are respectively arranged in four divided regions obtained by dividing the piezoelectric layer 11 in the direction D1 and the direction D2. The electrode portions 31 and 32 are positioned diagonally to each other. The electrode portions 33 and 34 are positioned diagonally to each other. The electrode portions 31 and 32 are arranged apart from each other on the piezoelectric layer 11. The electrode portions 33 and 34 are connected to each other by a connecting portion 36 on the piezoelectric layer 11.

On the piezoelectric layer 11, the electrode portion 31 is disposed close to a corner formed by the end surface 2a and the side surface 2c of the piezoelectric element body 2. The electrode portion 31 includes a main electrode part 31a and a connecting part 31b. The main electrode part 31a and the connecting part 31b are integrally formed. The main electrode part 31a has a substantially rectangular shape and is separated from the end surfaces 2a and 2b and the side surfaces 2c and 2d. The connecting part 31b extends from the main electrode part 31a toward the side surface 2c and is exposed on the side surface 2c.

On the piezoelectric layer 11, the electrode portion 32 is disposed close to a corner that is diagonal to the corner close to the electrode portion 31 and is formed by the end surface 2b and the side surface 2d of the piezoelectric element body 2. The electrode portion 32 includes a main electrode part 32a and a connecting part 32b. The main electrode part 32a and the connecting part 32b are integrally formed. The main electrode part 32a has a substantially rectangular shape and is separated from the end surfaces 2a and 2b and the side surfaces 2c and 2d. The connecting part 32b extends from the main electrode part 32a toward the side surface 2d and is exposed on the side surface 2d.

On the piezoelectric layer 11, the electrode portion 33 is disposed close to a corner formed by the end surface 2b and the side surface 2c of the piezoelectric element body 2. The electrode portion 33 includes a main electrode part 33a and a connecting part 33b. The main electrode part 33a and the connecting part 33b are integrally formed. The main electrode part 33a has a substantially rectangular shape and is separated from the end surfaces 2a and 2b and the side surfaces 2c and 2d. The connecting part 33b extends from the main electrode part 33a toward the side surface 2c and is exposed on the side surface 2c.

On the piezoelectric layer 11, the electrode portion 34 is disposed close to a corner that is diagonal to the corner close to the electrode portion 33 and is formed by the end surface 2a and the side surface 2d of the piezoelectric element body 2. The electrode portion 34 includes a main electrode part 34a and a connecting part 34b. The main electrode part 34a and the connecting part 34b are integrally formed. The main electrode part 34a has a substantially rectangular shape and is separated from the end surfaces 2a and 2b and the side surfaces 2c and 2d. The connecting part 34b extends from the main electrode part 34a toward the side surface 2d and is exposed on the side surface 2d.

The connecting portion 35 electrically connects the electrode portion 33 and the electrode portion 34. Specially, the connecting portion 35 electrically connects the main electrode part 33a of the electrode portion 33 and the main electrode part 34a of the electrode portion 34. The connecting portion 35 is arranged at the center of the direction D1 and the direction D2 on the piezoelectric layer 11. The connecting portion 35 is disposed between the electrode portion 31 and the electrode portion 32 that are diagonally disposed at a predetermined interval. The connecting portion 35 is spaced apart from the electrode portion 31 and the electrode portion 32. The connecting portion 35 extends in a direction inclined with respect to the direction D1 and the direction D2 when viewed from the direction D3.

The lengths of the connecting parts 20b, 20c, 31b, 32b, 33b, and 34b in the direction D1 are, for example, equal to each other and are 0.9 mm or more and 1.4 mm or less. The lengths of the connecting parts 20b, 20c, 31b, 32b, 33b, and 34b in the direction D1 are equal to or less than the length of the external electrodes 4, 5, 6, 7, 8, and 9 in the direction D1. Accordingly, since the exposed portion of the internal electrode is protected by the external electrode, it is possible to prevent solder from penetrating into the internal electrode side (solder leaching of the internal electrode), the solder being used when a flexible printed circuit board (FPC) or the like is connected to the external electrode.

Figure 10:
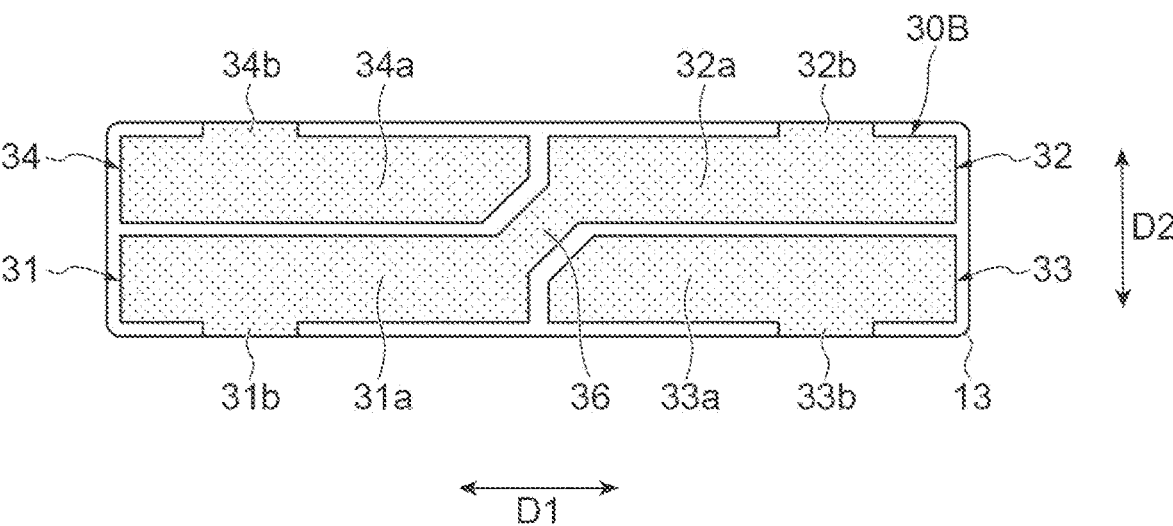
FIG. 10 is a plan view illustrating internal electrodes disposed on a piezoelectric layer.

FIG. 10 is a plan view showing the internal electrode 30B disposed on the piezoelectric layer 13. As shown in FIG. 10, the internal electrode 30B is different from the internal electrode 30A in that the internal electrode 30B includes the connecting portion 36 instead of the connecting portion 35 (see FIG. 9). The connecting portion 36 electrically connects the electrode portion 31 and the electrode portion 32. Specially, the connecting portion 36 electrically connects the main electrode part 31a of the electrode portion 31 and the main electrode part 32a of the electrode portion 32. The connecting portion 36 is arranged at the center of the direction D1 and the direction D2 on the piezoelectric layer 13. The connecting portion 36 is disposed between the electrode portion 33 and the electrode portion 34 that are diagonally disposed at a predetermined interval. The connecting portion 36 is spaced apart from the electrode portion 33 and the electrode portion 34. The connecting portion 36 extends in a direction inclined with respect to the direction D1 and the direction D2 when viewed from the direction D3. The internal electrode 30B is also disposed on the piezoelectric layer 17. The internal electrode 30B disposed on the piezoelectric layer 17 and the internal electrode 30B disposed on the piezoelectric layer 13 have the same shape.

In each of the internal electrodes 30A and 30B, the connecting parts 31b are respectively connected to the external electrode 4 on the side surface 2c. The electrode portions 31 are electrically connected to each other via the external electrode 4. The connecting parts 32b are respectively connected to the external electrode 8 on the side surface 2d. The electrode portions 32 are electrically connected to each other via the external electrode 8. The connecting parts 33b are respectively connected to the external electrode 5 on the side surface 2c. The electrode portions 33 are electrically connected to each other via the external electrode 5. The connecting parts 34b are respectively connected to the external electrode 7 on the side surface 2d. The electrode portions 34 are electrically connected to each other via the external electrode 7.

As described above, in the internal electrode 30A, the electrode portions 33 and 34 are connected to each other via the connecting portion 35. In the internal electrode 30B, the electrode portions 31 and 32 are connected to each other via the connecting portion 36. Therefore, all the electrode portions 31 and 32 are electrically connected to each other through the connecting portion 36, the external electrode 4, and the external electrode 8. All the electrode portions 33 and 34 are electrically connected to each other through the connecting portion 35, the external electrode 5 and the external electrode 7.

In the piezoelectric element 1 configured as described above, different potentials can be applied to the external electrodes 4, 5, and 6 by the wiring member 40. For example, the external electrode 6 is connected to the ground, and different potentials are applied to the external electrodes 4 and 5. This results in a plurality of piezoelectrically active regions in the piezoelectric element body 2. The plurality of active regions are formed corresponding to the electrode portions 31, 32, 33, and 34.

To be more specific, a region of the piezoelectric layers 11 to 18 is the active region, the region overlapping with the electrode portions 31, 32, 33, and 34 when viewed from the direction D3. In the piezoelectric layers 11 to 18, regions sandwiched between the main electrode part 31a of the electrode portion 31 and the main electrode part 20a of the internal electrode 20, between the main electrode part 32a of the electrode portion 32 and the main electrode part 20a of the internal electrode 20, between the main electrode part 33a of the electrode portion 33 and the main electrode part 20a of the internal electrode 20, and between the main electrode part 34*a* of the electrode portion 34 and the main electrode part 20*a* of the internal electrode 20 are active regions.

The piezoelectric element 1 has two resonance modes during driving. The piezoelectric element 1 vibrates by superposition of a longitudinal vibration mode and a bending vibration mode. The piezoelectric element 1 vibrates in the direction D1 in the longitudinal vibration mode. The piezoelectric element 1 bends and vibrates in the direction D2 in the bending vibration mode. In the piezoelectric element 1, for example, one of the active region corresponding to the electrode portions 31 and 32 and the active region corresponding to the electrode portions 33 and 34 is expanded and contracted along the direction D1, and the other active region is not displaced. As a result, the piezoelectric element 1 bends and vibrates in an S-shape when viewed from the direction D3.

(Wiring Member)

As shown in FIGS. 1 to 3, the wiring member 40 is electrically and physically connected to the piezoelectric element 1. The wiring member 40 is, for example, a flexible printed circuit (FPC) or a flexible flat cable (FFC). The wiring member 40 includes a base 41 and a plurality of conductors 42, 43, and 44. The base 41 is made of a resin such as, for example, polyimide or the like. The conductors 42, 43, and 44 are arranged in this order on one surface of the base 41 so as to be separated from each other. The conductors 42, 43, and 44 are joined to one surface of the base 41 by an adhesive layer (not shown). The conductors 42, 43, and 44 is made of, for example, Cu. The conductors 42, 43, and 44 may have, for example, a configuration in which an Ni-plated layer and an Au-plated layer are provided in this order on a Cu layer.

Although not shown, a cover made of a resin such as, for example, polyimide or the like is provided on one surface of the base 41. An end portion of the conductors 42, 43, and 44 is exposed from the cover. The wiring member 40 is disposed such that one surface of the base 41 opposes the side surface 2*c* of the piezoelectric element 1. The end of the conductor 42 is connected to the external electrode 4 of the piezoelectric element 1 by a solder 45. The end of a conductor 43 is connected to the external electrode 6 of the piezoelectric element 1 by the solder 45. The end of a conductor 44 is connected to the external electrode 5 of the piezoelectric element 1 by the solder 45. The wiring member 40 is connected to a drive circuit (not shown) disposed outside the housing 80.

(Contact)

The contact 46 is disposed on the end surface 2*a* of the piezoelectric element 1. The contact 46 is attached to the end surface 2*a*, for example by gluing. The contact 46 has, for example, a prismatic shape. The contact 46 is made of zirconia, alumina, or the like. The contact 46 is pressure-welded to the sliding plate 204 of the moving object 200.

(Supporter)

Figure 11:
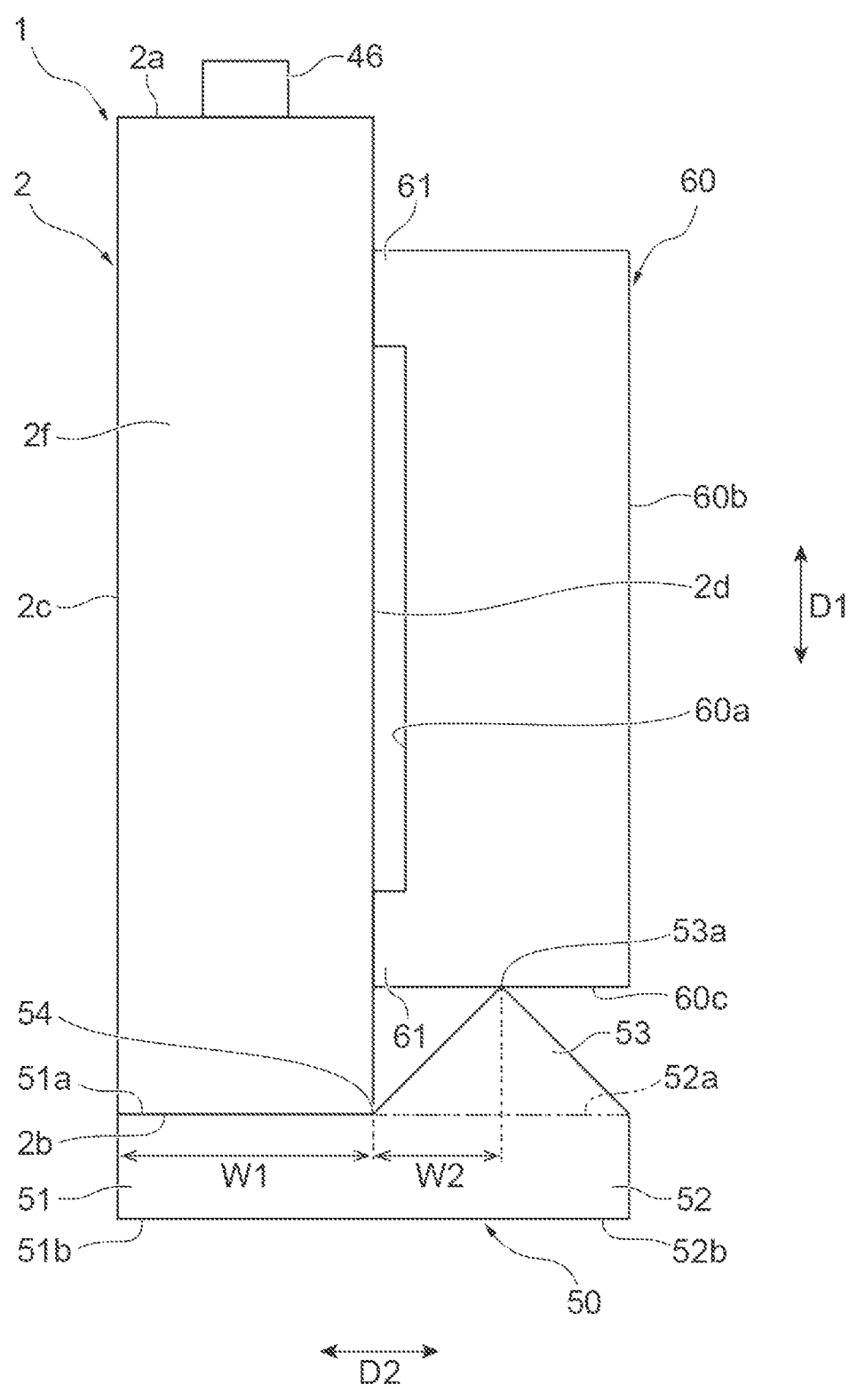
FIG. 11 is a side view illustrating a piezoelectric element, a contact, a first supporter, and a second supporter.

As shown in FIGS. 1 to 3 and 11, the first supporter 50 opposes the moving object 200 via the piezoelectric element 1 in the direction D1, and supports the end surface 2*b*. In FIG. 11, external electrodes 4 to 9 are not shown. The first supporter 50 is made of, for example, resin. The first supporter 50 is made of plastic such as polyphenylene sulfide (PPS) or liquid crystal polymer (LCP). According to the first supporter 50 made of resin, the piezoelectric element 1 is hardly scratched. The first supporter 50 is biased toward the end surface 2*b* by the first biasing member 71. The first supporter 50 is provided to be movable in a direction orthogonal to the direction D3 according to the deformation of the end surface 2*b*. The first supporter 50 is formed to have the same thickness as the piezoelectric element 1. That is, the length of the first supporter 50 in the direction D3 is equal to the length of the piezoelectric element 1 in the direction D3.

The first supporter 50 includes a support portion 51, an opposing portion 52, a protruding portion 53, and a positioning portion 54. The support portion 51 includes a first surface 51*a* and a second surface 51*b* which oppose each other in the direction D1. The first surface 51*a* is in contact with the end surface 2*b* and supports the end surface 2*b*. The first surface 51*a* has a rectangular shape. The first surface 51*a* and the end surface 2*b* have substantially the same shape. The first biasing member 71 is brought into contact with the second surface 51*b*. In the present embodiment, the second surface 51*b* and the first surface 51*a* have the same shape.

The opposing portion 52 includes a first surface 52*a* and a second surface 52*b* which oppose each other in the direction D1. The first surface 52*a* opposes the second supporter 60 in the direction D1. The first surface 52*a* is continuous with the first surface 51*a* and forms the same plane as the first surface 51*a*. The second surface 52*b* is continuous with the second surface 51*b* and forms the same plane as the second surface 51*b*.

The protruding portion 53 protrudes from the first surface 52*a* of the opposing portion 52 in the direction D1. The protruding portion 53 includes a top portion 53*a* that abuts on the second supporter 60. The top portion 53*a* is an abutting portion of the protruding portion 53 with the second supporter 60. The first supporter 50 and the second supporter 60 are in point contact with each other when viewed from the direction D3. Since the top portion 53*a* extends in the direction D3, the first supporter 50 and the second supporter 60 are in line contact with each other.

A distance W2 in which the abutting portion of the protruding portion 53 with the second supporter 60, that is, the top portion 53*a* is separated from the piezoelectric element 1 in the direction D2 is 0.3 times or more and 0.7 times or less a length W1 the piezoelectric element 1 (the piezoelectric element body 2) in the direction D2. In the present embodiment, the protruding portion 53 is provided on the entire surface of the first surface 52*a* of the opposing portion 52. The protruding portion 53 has a tapered shape in which the widths in the direction D2 gradually decrease as the distance from the first surface 52*a* increases in the direction D1. The protruding portion 53 has a triangular column shape with the direction D3 as an axial direction. The protruding portion 53 has a triangular shape when viewed from the direction D3. For example, the protruding portion 53 has an isosceles triangle shape whose base is the first surface 52*a* when viewed from the direction D3.

The positioning portion 54 defines the position of the piezoelectric element 1 in the direction D2. The positioning portion 54 is constituted by a step portion between the first surface 51*a* of the support portion 51 or the first surface 52*a* of the opposing portion 52 and the protruding portion 53. In the present embodiment, the protruding portion 53 is provided on the entire surface of the first surface 52*a* of the opposing portion 52, and the protruding portion 53 is adjacent to the first surface 51*a* of the support portion 51. Therefore, the positioning portion 54 is constituted by a step portion between the first surface 51*a* of the support portion 51 and the protruding portion 53. The positioning portion 54 is in contact with the ridge portion 2*g* between the end surface 2*b* and the side surface 2*d*, and prevents the piezoelectric element 1 from moving to the protruding portion 53 side from the positioning portion 54 in the direction D2.

The second supporter 60 is opposed to the wiring member 40 and a disposition surface 82s described later via the piezoelectric element 1 in the direction D2, and supports the side surface 2d. The second supporter 60 is a separate member from the first supporter 50. The second supporter 60 is made of, for example, the same material as the first supporter 50. The second supporter 60 is made of, for example, resin. The second supporter 60 is made of plastic such as polyphenylene sulfide (PPS) or liquid crystal polymer (LCP). According to the second supporter 60 made of resin, the piezoelectric element 1 is hardly scratched. The second supporter 60 is biased toward the side surface 2d by the second biasing member 72. The second supporter 60 is provided to be movable in a direction orthogonal to the direction D3 according to the deformation of the side surface 2d. The second supporter 60 is formed to have the same thickness as the piezoelectric element 1. That is, the length of the second supporter 60 in the direction D3 is equal to the length of the piezoelectric element 1 in the direction D3.

The second supporter 60 includes a first surface 60a and a second surface 60b which oppose each other in the direction D2, a third surface 60c which opposes the first supporter 50 in the direction D1, and a pair of a support portion 61. The first surface 60a is opposed to the side surface 2d in the direction D2. The first surface 60a has a rectangular shape and has substantially the same shape as the side surface 2d. The second biasing member 72 is brought into contact with the second surface 60b. In the present embodiment, the second surface 60b has the same shape as the first surface 60a. The third surface 60c is opposed to the opposing portion 52 and the protruding portion 53 of the first supporter 50 in the direction D1, and abuts on the top portion 53a of the protruding portion 53.

The pair of support portions 61 are separated from each other in the direction D1. The pair of support portions 61 protrudes from the first surface 60a in the direction D2. The pair of support portions 61 is in contact with the piezoelectric element 1 and supports the side surface 2d. That is, the second supporter 60 supports the piezoelectric element 1 at two positions. One the support portion 61 is disposed at one end in the direction D2 of the first surface 60a and is in contact with the external electrode 7. The other the support portion 61 is disposed at the other end in the direction D2 of the first surface 60a and is in contact with the external electrode 8. The length of the support portion 61 in the direction D1 is shorter than the length of the external electrodes 7 and 8 in the direction D1. The protruding height of the support portion 61 (length in the direction D2) is set in accordance with the magnitude of the piezoelectric element 1 so that the side surface 2d does not come into contact with the first surface 60a even if the piezoelectric element 1 vibrates.

(Biasing Member)

The first biasing member 71 biases the first supporter 50 in the direction D1 to abut on the end surface 2b. The first biasing member 71 is an elastic member such as a coil spring. One end of the first biasing member 71 is in contact with the second surface 51b of the support portion 51 of the first supporter 50. The first biasing member 71 is disposed so as to overlap the support portion 51 and the piezoelectric element 1 when viewed from the direction D1. Since the first biasing member 71 does not abut on the piezoelectric element 1, the piezoelectric element 1 is hardly scratched.

The second biasing member 72 biases the second supporter 60 in the direction D2 to abut on the piezoelectric element 1. The second biasing member 72 is an elastic member such as a coil spring. One end of the second biasing member 72 is in contact with the second surface 60b of the second supporter 60. One end of the second biasing member 72 is in contact with the central portion of the second surface 60b in the direction D1. The second biasing member 72 is located between the pair of support portions 61 in the direction D1. The second biasing member 72 is disposed at a position not overlapping with any of the pair of support portions 61 when viewed from the direction D2. Since the second biasing member 72 does not abut on the piezoelectric element 1, the piezoelectric element 1 is hardly scratched.

(Housing)

As shown in FIGS. 1 to 3, the housing 80 accommodates the piezoelectric element 1, the end portion of the wiring member 40, the first supporter 50, the second supporter 60, the first biasing member 71, and the second biasing member 72. The housing 80 includes a bottom wall 81 and side walls 82, 83, 84, and 85. The bottom wall 81 and the side walls 82, 83, 84, and 85 are integrally formed. The above-described members such as the piezoelectric element 1 are disposed on the bottom wall 81. The bottom wall 81 is opposed to each of the above-described members such as the piezoelectric element 1 in the direction D3.

The side walls 82, 83, 84, and 85 are provided on the bottom wall 81 so as to surround the above-described members such as the piezoelectric element 1 when viewed from the direction D3. The side wall 82 and the side wall 83 are opposed to each other in the direction D2. The side walls 82 and 83 extend in the direction D1. The side walls 84 and 85 are opposed to each other in the direction D1. The side walls 84 and 85 extends in the direction D2. The side wall 84 connects one end of the side wall 82 and one end of the side wall 83 in the direction D1. The side wall 85 is connected to the other end of the side wall 83 in the direction D1. The side wall 85 is spaced apart from the side wall 82. An end portion on the end surface 2a side of the piezoelectric element 1 is disposed between the side wall 85 and the side wall 82. The end surface 2a is exposed from the housing 80. The contact 46 is disposed outside the housing 80.

The wiring member 40 is pulled out of the housing 80 along the direction D3. The housing 80 may further include a cover portion that opposes the bottom wall 81 in the direction D3 and covers each of the above-described members such as the piezoelectric element 1. In this case, the cover portion may be provided with a hole portion through which the wiring member 40 is pulled out.

The side wall 82 has the disposition surface 82s in which the piezoelectric element 1 is disposed via the end portion of the wiring member 40. The disposition surface 82s is orthogonal in the direction D2. The disposition surface 82s and the first supporter 50 are opposed to each other in the direction D2 with gaps (spaces) interposed therebetween. Therefore, the side wall 82 is prevented from interfering with the first supporter 50. The disposition surface 82s includes a pair of first regions R1 in contact with the wiring member 40 and a second region R2 not in contact with the wiring member 40. The wiring member 40 is not bonded to the disposition surface 82s.

One of the first regions R1 is provided in correspondence with the conductor 42 and the external electrode 4. The other of the first regions R1 is provided in correspondence with the conductor 44 and the external electrode 5. The second region R2 is disposed between the pair of the first regions R1 in the direction D1. The second region R2 is provided in correspondence with the conductor 43 and the external electrode 6. When viewed from a direction orthogonal to the disposition surface 82s (that is, the direction D2), the second region R2 has a size that covers the entirety of the conductor 43 and the external electrode 6. The length of the second region R2 in the direction D1 is longer than the length of the conductor 43 in the direction D1 and the length of the external electrode 6 in the direction D1.

In the side wall 82, a cutout portion 82a for exposing the bottom wall 81 is provided from the disposition surface 82s toward the outside of the housing 80. The cutout portion 82a is provided as a recess that does not pass through the side wall 83, but may be a through hole. The depth (length in the direction D2) of the recess is set in accordance with the amplitudes of the piezoelectric element 1 so that the wiring member 40 does not come into contact with the bottom surface of the recess even if the piezoelectric element 1 vibrates. The second region R2 is constituted by the cutout portion 82a. When viewed from the direction D1, the conductor 43 and the external electrode 6 are disposed in the cutout portion 82a. The space formed by the cutout portion 82a and the bottom wall 81 is connected to the internal space of the housing 80.

The side wall 83 is opposed to each of the first supporter 50 and the second supporter 60 in the direction D2 with gaps (spaces) interposed therebetween. Therefore, the side wall 83 is prevented from interfering with each of the first supporter 50 and the second supporter 60. The side wall 84 is opposed to the first supporter 50 in the direction D1 with gaps (spaces) interposed therebetween. Therefore, the side wall 84 is prevented from interfering with the first supporter 50. The side wall 85 is opposed to the second supporter 60 in the direction D1 with gaps (spaces) interposed therebetween. Therefore, the side wall 85 is prevented from interfering with the second supporter 60. The side wall 85 is opposed to the side surface 2d of the piezoelectric element 1 in the direction D2 with gaps (spaces) interposed therebetween. Therefore, the side wall 85 is prevented from interfering with the piezoelectric element 1.

The side wall 84 is provided with a cutout portion 84a for exposing the bottom wall 81. The cutout portion 84a is provided as a recess that does not pass through the side wall 84. The cutout portion 84a and the bottom wall 81 constitute a housing portion 86 that accommodates the first biasing member 71. The internal space of the housing portion 86 is connected to the internal space of the housing 80. The side wall 83 is provided with a cutout portion 83a for exposing the bottom wall 81. The cutout portion 83a is provided as a recess that does not pass through the side wall 83. The cutout portion 83a and the bottom wall 81 constitute a housing portion 87 that accommodates the second biasing member 72. The internal space of the housing portion 87 is connected to the internal space of the housing 80.

(Movements of Piezoelectric Actuator)

Figures 12A, 12B, 12C:
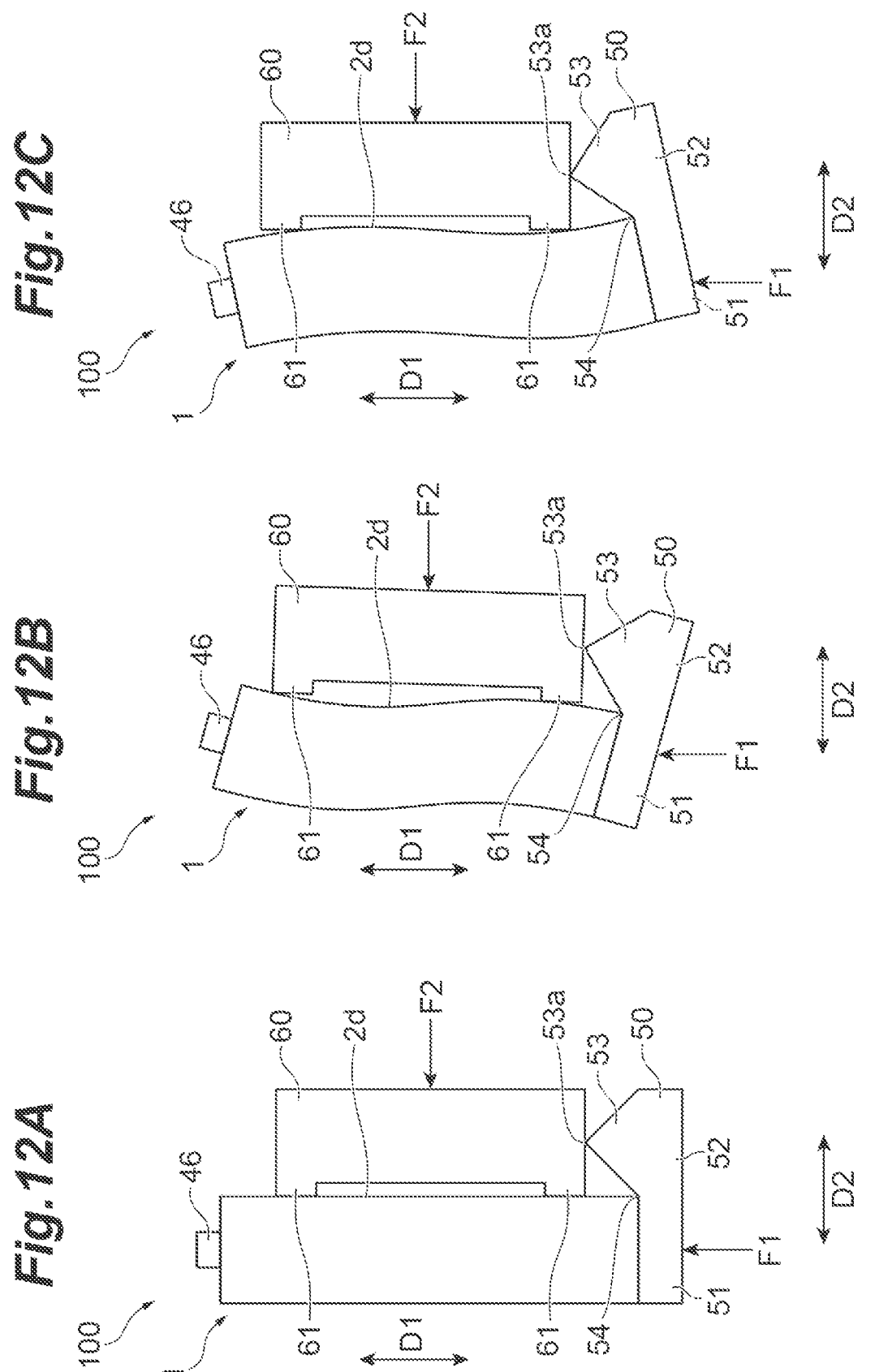
FIGS. 12A, 12B, and 12C are side views schematically illustrating movements of the piezoelectric actuator of FIG. 1.

The movements of the piezoelectric actuator 100 will be described with reference to FIGS. 12A, 12B, and 12C. In FIGS. 12A, 12B, and 12C, the wiring member 40, the first biasing member 71, the second biasing member 72, the housing 80, and the external electrodes 4 to 9 are not shown. FIG. 12A shows a state where no voltage (potential) is applied to the external electrodes 4, 5, and 6 (see FIG. 4). FIG. 12B shows a state in which the external electrode 6 is connected to the ground, a positive voltage is applied to the external electrode 5, and 0 voltage is applied to the external electrode 4. At this time, the active regions corresponding to the electrode portions 31 and 32 (see FIGS. 9 and 10) are deformed so as to be contracted in the direction D1. As a result, the piezoelectric element 1 is deformed in an S shape when viewed from the main surface 2f side. FIG. 12C shows a state in which the external electrode 6 is connected to the ground, a negative voltage is applied to the external electrode 5, and 0 voltage is applied to the external electrode 4. At this time, the active regions corresponding to the electrode portions 33 and 34 are deformed so as to extend in the direction D1. As a result, the piezoelectric element 1 is deformed into an inverted S-shape when viewed from the main surface 2f side.

A sinusoidal voltage having positive and negative amplitudes is applied to the piezoelectric element 1, and the state of FIG. 12B and the state of FIG. 12C are continuously repeated, so that the piezoelectric actuator 100 continuously moves. As a result, the force is transmitted from the contact 46 to the moving object 200 (see FIG. 1) and converted into the motion of the moving object 200. Since the biasing force (pressurizing force) F1 along the direction D1 by the first biasing member 71 (see FIG. 1) is applied to the first supporter 50, the first supporter 50 moves in accordance with the deformation of the end surface 2b, and the support portion 51 keeps to abut on the end surface 2b. Since the biasing force (pressurizing force) F2 along the direction D2 by the second biasing member 72 (see FIG. 1) is applied to the second supporter 60, the second supporter 60 moves in accordance with the deformation of the side surface 2d, and the pair of support portions 61 keeps to abut on the external electrodes 7 and 8.

The pair of support portions 61 is in contact with nodes of vibration of the piezoelectric element 1 or the vicinity of the node. The nodes are positions where no amplitude occurs in vibration. The pair of support portions 61 is not in contact with antinode of vibration of the piezoelectric element 1. The antinode is a position where amplitude is maximum in vibration. Therefore, the pair of support portions 61 can support the piezoelectric element 1 without inhibiting the vibration of the piezoelectric element 1.

The top portion 53a of the protruding portion 53 of the first supporter 50 is in contact with the second supporter 60 at least in the state shown in FIG. 12A. As shown in FIGS. 12B and 12C, even when the first supporter 50 moves, the position of the top portion 53a hardly changes. In addition, the contact position of the top portion 53a in the second supporter 60 hardly changes. The top portion 53a does not interfere with the second supporter 60 because the top portion 53 is disposed at a position where in the top portion 53 is contact with or slightly apart from the second supporter 60. Therefore, in the piezoelectric actuator 100, smooth motion of the piezoelectric element 1 is realized.

As illustrated in FIGS. 13A, 13B, and 13C, a piezoelectric actuator 110 according to a comparative example includes a first supporter 150 instead of the first supporter 50. The first supporter 150 is different from the first supporter 50 in that the top portion 53a of the protruding portion 53 is in contact with the piezoelectric element 1 and is not separated from the piezoelectric element 1. As in FIG. 12A, FIG. 13A shows a state where no voltage (potential) is applied to the external electrodes 4, 5, and 6 (see FIG. 4). As in FIG. 12B, FIG. 13B shows a state in which the external electrode 6 is connected to the ground, a positive voltage is applied to the external electrode 5, and 0 voltage is applied to the external electrode 4. As in FIG. 12C, FIG. 13C shows a state in which the external electrode 6 is connected to the ground, a negative voltage is applied to the external electrode 5, and 0 voltage is applied to the external electrode 4.

Also in the piezoelectric actuator 110, the top portion 53a of the protruding portion 53 of the first supporter 50 is in contact with the second supporter 60 at least in the state shown in FIG. 13A. As shown in FIGS. 13B and 13C, when the first supporter 50 moves, the position of the top portion 53*a* changes. In particular, in the state illustrated in FIG. 13B, the top portion 53*a* overlaps the second supporter 60. This indicates that the top portion 53*a* interferes with the second supporter 60.

FIG. 14 shows the relationship between the frequencies of the voltages applied to the piezoelectric element 1 and the moving speeds of the moving object 200 in the example in which the top portion 53*a* does not interfere with the second supporter 60 and the comparative example in which the top portion 53*a* interferes with the second supporter 60. In the design of the comparative example with interference, since the movement of the piezoelectric element 1 is inhibited, the shape of the graph is distorted and the peak is relatively low. On the other hand, in the design of the example with no interference, since the movement of the piezoelectric element 1 is not inhibited, the shape of the graph is gentle and the peak is relatively high.

(Effect)

As described above, in the piezoelectric actuator 100, the first supporter 50 is provided to be movable according to the deformation of the end surface 2*b* of the piezoelectric element 1. The second supporter 60 is provided to be movable according to the deformation of the side surface 2*d* of the piezoelectric element 1. As described above, since the first supporter 50 and the second supporter 60 are provided to be movable separately, the vibration of the piezoelectric element 1 is less likely to be inhibited. The first supporter 50 includes the top portion 53*a* that abuts on the second supporter 60. Therefore, when the piezoelectric actuator 100 is assembled, the position of the second supporter 60 is likely to be uniquely determined with respect to the first supporter 50. Therefore, the piezoelectric actuator 100 can be easily assembled.

The distance W2 at which the piezoelectric element 1 and the top portion 53*a* of the protruding portion 53 are spaced apart from each other in the direction D2 is 0.3 times or more and 0.7 times or less the length W1 of the piezoelectric element 1 in the direction D2. Therefore, even if the first supporter 50 and the second supporter 60 move according to the vibration of the piezoelectric element 1, the first supporter 50 and the second supporter 60 are prevented from interfering with each other. Therefore, the vibration of the piezoelectric element 1 is prevented from being inhibited.

The first biasing member 71 biases the first supporter 50 in the direction D1 to bring the first supporter 50 into contact with the end surface 2*b*. Therefore, a configuration in which the first supporter 50 is movable in accordance with the deformation of the end surface 2*b* is easily realized. Since the first surface 51*a* of the first supporter 50 is not bonded to the end surface 2*b*, the vibration of the piezoelectric element 1 is prevented from being inhibited.

The second biasing member 72 biases the second supporter 60 in the direction D2 to bring the second supporter 60 into contact with the external electrodes 7 and 8. Therefore, a configuration in which the second supporter 60 is movable in accordance with the deformation of the side surface 2*d* is easily realized. Since each of the support portions 61 of the second supporter 60 is not bonded to the piezoelectric element 1, the vibration of the piezoelectric element 1 is prevented from being inhibited.

Since the second supporter 60 supports the side surface 2*d* by the pair of support portions 61, the side surface 2*d* can be reliably supported. The second biasing member 72 is located between the pair of support portions 61 in the direction D2. Therefore, the second biasing member 72 can apply the biasing force to the pair of support portions 61 in a balanced manner. It is efficient because the single second biasing member 72 can support the side surface 2*d* at two points.

The first supporter 50 includes the positioning portion 54 that defines the position of the piezoelectric element 1 in the direction D2. Therefore, it is possible to prevent the piezoelectric element 1 from moving in the direction D2 on the first supporter 50.

When viewed from the direction D2 orthogonal to the disposition surface 82*s*, the second region R2 has a size that covers the entire external electrode 6. Therefore, the external electrode 6 is reliably prevented from interfering with the disposition surface 82*s* via the wiring member 40. Therefore, the vibration can be reliably transmitted to the moving object 200.

The pair of first regions R1 is provided so as to correspond to the external electrodes 4 and 5. Therefore, since the wiring member 40 and the disposition surface 82*s* are brought into a state close to point contact with each other, the position where the piezoelectric element 1 is pressed is accurately determined and the vibration is stabilized.

The second region R2 is disposed between the pair of first regions R1. The external electrodes 4 and 5 protrudes from the side surface 2*c* of the piezoelectric element body 2 by the thickness of the external electrodes 4 and 5. Therefore, the piezoelectric element 1 is supported by the disposition surface 82*s* via the wiring member 40 in the pair of first regions R1. Since the piezoelectric element 1 is supported at two points as described above, the piezoelectric element 1 is stably disposed on the disposition surface 82*s* without being inclined or rattling.

The second region R2 is constituted by the cutout portion 82*a* which is a recess or a through hole provided in the disposition surface 82*s*. Therefore, it is possible to easily realize a configuration in which the second region R2 does not come into contact with the wiring member 40.

Second Embodiment

As shown in FIG. 15, a piezoelectric actuator 100A according to the second embodiment is different from the piezoelectric actuator 100 in that the piezoelectric actuator 100A includes a first supporter 50A and a second supporter 60A. The top portion 53*a* of the protruding portion 53 in the first supporter 50A has a curved surface (R surface or C surface) that is rounded, and the curved surface is in contact with the second supporter 60A. Thus, the breakage of the protruding portion 53 is suppressed. In addition, damage to the third surface 60*c* of the second supporter 60A is also suppressed, the third surface 60*c* being in contact with the top portion 53*a*. Each of the pair of support portions 61 of the second supporter 60A has a curved surface (an R surface or a C surface) that is rounded. The curved surface of the pair of support portions 61 are in contact with the external electrodes 7 and 8. Accordingly, damage to the pair of support portions 61 is suppressed. In addition, damage to the external electrodes 7 and 8 in contact with the pair of support portions 61 is also suppressed.

Third Embodiment

As shown in FIGS. 16 and 17, a piezoelectric actuator 100B according to the third embodiment is different from the piezoelectric actuator 100 in that the piezoelectric actuator 100B includes a first supporter 50B and a second supporter 60B. The first supporter 50B is rotatably connected to the second supporter 60B by a coupling shaft 90 provided in the protruding portion 53. The protruding portion 53 and the end portion of the second supporter 60B on the third surface 60c side are disposed so as to overlap each other when viewed from the direction D3. The coupling shaft 90 is inserted through a through hole provided in the protruding portion 53, and is inserted into a hole provided in the end portion of the second supporter 60B on the third surface 60c side. In the piezoelectric actuator 100B, since the first supporter 50B and the second supporter 60B are connected by the coupling shaft 90, the position of the second supporter 60B is reliably determined with respect to the first supporter 50B. Therefore, assembly is easier.

As described with reference to FIGS. 12A, 12B, and 12C, in the piezoelectric actuator 100, even if the first supporter 50 and the second supporter 60 move due to vibration of the piezoelectric element 1, the contact positions of the first supporter 50 and the second supporter 60 hardly change. In the piezoelectric actuator 100B, the coupling shaft 90 does not inhibit the vibration of the piezoelectric element 1 because the coupling shaft 90 is provided at portions of the first supporter 50B and the second supporter 60B that hardly move.

Although the embodiments of the present invention have been described above, the present invention is not necessarily limited to the above-described embodiments, and various modifications can be made without departing from the scope of the present invention.

[Modification]

In the above-described embodiment, the configuration in which the piezoelectric element body 2 are formed by laminating the piezoelectric layers 10 to 19 has been described as an example. However, the number of laminated piezoelectric layers is not limited to the above, and may be appropriately set according to the design. In the above-described embodiment, a pair of the internal electrode 20 is disposed at the laminating ends, but the internal electrodes 30A and 30B may be disposed. The internal electrodes 30A and 30B may be exposed to the ridge portions 2g. The thicknesses of the piezoelectric layers 10 to 19 may be equal to each other. The ridge portions 2g and the corner portions 2h may not have rounded chamfered shapes.

The first surface 51a of the first supporter 50 may be bonded to the end surface 2b. The second biasing member 72 may be disposed at a position overlapping the support portion 61 when viewed from the direction D2. The piezoelectric actuator 100 may include a pair of second biasing members 72. In this case, the pair of second biasing members 72 may be disposed so as to oppose the pair of support portions 61 in the direction D2. That is, one of the second biasing members 72 may be disposed so as to oppose one of the support portions 61 in the direction D2, and the other of second biasing members 72 may be disposed so as to oppose the other of support portions 61 in the direction D2.

The pair of support portions 61 may be in contact with the side surface 2d. That is, the pair of support portions 61 may be in contact with a portion of the side surface 2d where the external electrodes 7 to 9 are not provided. The pair of support portions 61 may be in contact with, for example, a portion located between the external electrode 7 and the external electrode 9 in the side surface 2d, and a portion located between the external electrode 8 and the external electrode 9 in the side surface 2d.

The above-described embodiments and modifications may be appropriately combined.

The invention claimed is:

1. A piezoelectric actuator for driving an object, comprising:

a piezoelectric element having a rectangular shape and including a pair of main surfaces opposing each other, a first end surface and a second end surface opposing each other in a long side direction of the pair of main surfaces, and a first side surface and a second side surface opposing each other in a short side direction of the pair of main surfaces;

a first supporter opposing the object in the long side direction via the piezoelectric element and supporting the first end surface; and a second supporter opposing a disposition surface of a housing in which the piezoelectric element is disposed in the short side direction via the piezoelectric element and supporting the first side surface, wherein the first supporter is provided to be movable according to deformation of the first end surface, the second supporter is provided to be movable according to deformation of the first side surface, and the first supporter includes an opposing portion opposing the second supporter in the long side direction, and a protruding portion protruding from the opposing portion in the long side direction and abutting on the second supporter.

2. The piezoelectric actuator according to claim 1, wherein a distance at which an abutting portion of the protruding portion with the second supporter is spaced apart from the piezoelectric element in the short side direction is 0.3 times or more and 0.7 times or less of a length of the piezoelectric element in the short side direction.

3. The piezoelectric actuator according to claim 1, further comprising:

a first biasing member biasing the first supporter in the long side direction to bring the first supporter into contact with the piezoelectric element; and a second biasing member biasing the second supporter in the short side direction to bring the second supporter into contact with the piezoelectric element.

4. The piezoelectric actuator according to claim 1, further comprising:

a first biasing member biasing the first supporter in the long side direction to bring the first supporter into contact with the piezoelectric element; and a second biasing member biasing the second supporter in the short side direction to bring the second supporter into contact with the piezoelectric element, wherein the second supporter includes a pair of support portions spaced apart from each other in the long side direction and supporting the first side surface, and the second biasing member is located between the pair of support portions in the long side direction.

5. The piezoelectric actuator according to claim 1, wherein the second supporter includes a pair of support portions spaced apart from each other in the long side direction and supporting the first side surface.

6. The piezoelectric actuator according to claim 4, wherein each of the pair of support portions includes a curved surface that abuts on the piezoelectric element.

7. The piezoelectric actuator according to claim 1, wherein the protruding portion includes a curved surface.

8. The piezoelectric actuator according to claim 1, wherein the first supporter includes a positioning portion that defines a position of the piezoelectric element in the short side direction.

9. The piezoelectric actuator according to claim 1, wherein the first supporter is rotatably connected to the second supporter by a coupling shaft provided on the protruding portion.

* * * * *